United States Patent
Yamazaki et al.

(10) Patent No.: US 6,580,094 B1
(45) Date of Patent: Jun. 17, 2003

(54) ELECTRO LUMINESCENCE DISPLAY DEVICE

(75) Inventors: Shunpei Yamazaki, Tokyo (JP); Toshimitsu Konuma, Kanagawa (JP); Jun Koyama, Kanagawa (JP); Kazutaka Inukai, Kanagawa (JP); Mayumi Mizukami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/697,069

(22) Filed: Oct. 26, 2000

(30) Foreign Application Priority Data

Oct. 29, 1999 (JP) .......................................... 11-307869

(51) Int. Cl.$^7$ ........................ H01L 27/15; H01L 31/12; H01L 33/00; H01L 31/062; H01L 31/113

(52) U.S. Cl. ........................ 257/79; 257/344; 257/379; 257/408

(58) Field of Search ........................ 257/79, 103, 344, 257/368, 379, 390, 408

(56) References Cited

U.S. PATENT DOCUMENTS

| | | | |
|---|---|---|---|
| 5,463,483 A | 10/1995 | Yamazaki | |
| 5,594,569 A | 1/1997 | Konuma et al. | |
| 5,856,689 A | 1/1999 | Suzawa | |
| 5,904,514 A | 5/1999 | Konuma et al. | |
| 5,998,841 A | 12/1999 | Suzawa | |
| 6,121,652 A | * 9/2000 | Suzawa ........................ | 257/296 |
| 6,162,654 A | 12/2000 | Kawabe | |
| 6,208,392 B1 | 3/2001 | Miller et al. | |
| 6,236,064 B1 | 5/2001 | Mase et al. | |
| 6,255,705 B1 | * 7/2001 | Zhang ........................ | 257/412 |
| 6,271,543 B1 | 8/2001 | Ohtani et al. | |
| 6,380,687 B1 | 4/2002 | Yamazaki | |

FOREIGN PATENT DOCUMENTS

| | | |
|---|---|---|
| JP | 4-350627 A | 12/1992 |
| JP | 10-189252 | 7/1998 |

OTHER PUBLICATIONS

English abstract re Japanese patent application No. 10–189252 published Jul. 21, 1998.
Full English translation and English Abstract of JP 4–350627.
Inui et al., "Thresholdless Antiferroelectricity In Liquid Crystals And Its Application To Displays," *J. Mater. Chem.*, 1996, vol. 6, No. 4, pp. 671–673.
Yoshida et al., "A Full–Color Thresholdless Antiferroelectric LCD Exhibiting Wide Viewing Angle With East Response Time," *SID 97 DIGEST*, Jan. 1, 1997, pp. 841–844.
Sato et al., "High Resolution And Bright LCD Projector With Reflective LCD Panels," *SID 97 DIGEST*, May 13, 1997, pp. 997–1000.
Furue et al., "Characteristics And Driving Scheme Of Polymer–Stabilized Monostable FLCD Exhibiting Fast Response Time And High Contrast Ratio With Grey–Scale Capability," *SID 98 DIGEST*, Jan. 1, 1998, pp. 782–785.
Kurogane et al., "Reflective AMLCD For Projection Displays: D–ILA," *SID 98 DIGEST*, May 17, 1998, pp. 33–36.

(List continued on next page.)

*Primary Examiner*—Ngân V. Ngô
(74) *Attorney, Agent, or Firm*—Cook, Alex, McFarron, Manzo, Cummings & Mehler, Ltd.

(57) ABSTRACT

There is provided an electronic device having high reliability and high color reproducibility. A pixel structure is made such that a switching FET (201) and an electric current controlling FET (202) are formed on a single crystal semiconductor substrate (11), and an EL element (203) is electrically connected to the electric current controlling FET (202). The fluctuation in characteristics of the electric current controlling FET (202) is very low among pixels, and an image with high color reproducibility can be obtained. By taking hot carrier measures in the electric current controlling FET (202), the electronic device having high reliability can be obtained.

25 Claims, 14 Drawing Sheets

OTHER PUBLICATIONS

Nagata et al., "Silicon–Chip–Based Reflective PDLC Light Valve For Projection Display," *SID 98 DIGEST*, May 17, 1998, pp. 37–40.

Dove, "High Performance Projection Displays Based On Reflective LC Silicon Light Valves," *IDW '98*, Dec. 7, 1998, pp. 741–744.

Hirota et al., "A Silicon–Chip–Based Light Valve With Reflective Twisted Nematic Mode For High–Definition Projectors," *IDW '99*, Dec. 1, 1999, pp. 985–988.

US Patent Application No. 09/517,542 (pending) to Yamazaki et al. including PTO filing receipt, specification, claims, abstract, and drawings.

* cited by examiner

L1 = L1a + L1b + L1c

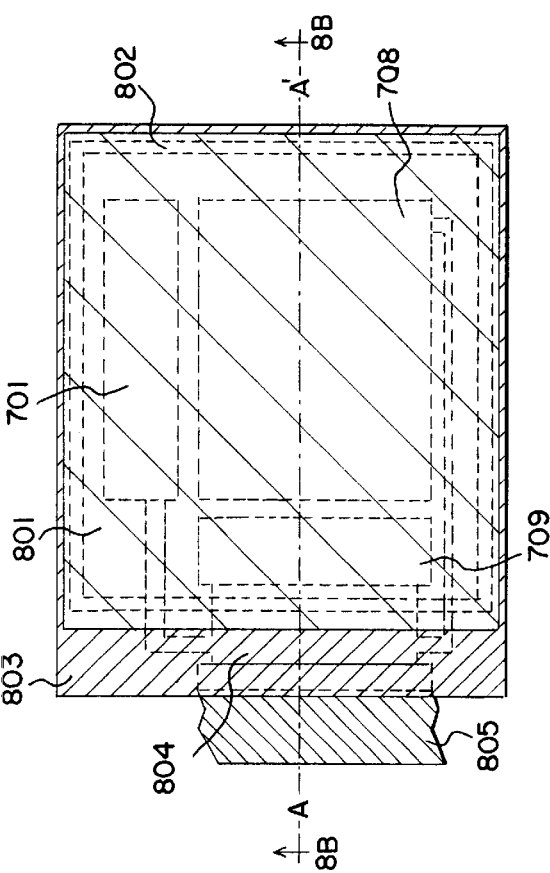
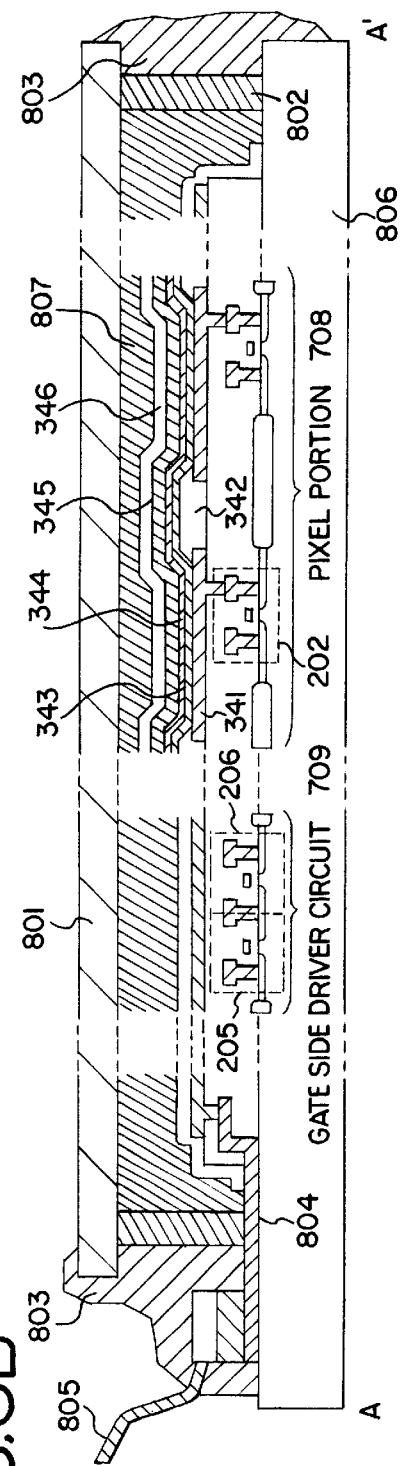
FIG.8A
FIG.8B

ELECTRO LUMINESCENCE DISPLAY DEVICE

BACKGROUND OF THE INVENTION

1. Field of the Invention

The present invention relates to an electronic device including an element having a luminous material placed between electrodes and an electronic instrument using the electronic device as a display portion (indication display or indication monitor). Particularly, the present invention relates to an electronic device using a luminous material (hereinafter referred to as EL material) by which EL (Electro Luminescence) is obtained.

2. Description of the Related Art

In recent years, an electronic device (hereinafter referred to as EL display device) which uses a light-emitting device (hereinafter referred to as an EL element) using an EL phenomenon of a luminous material has been developed. Since the EL display device is a display device using the light-emitting device, a backlight as in liquid crystal display is not necessary, and further, since an angle of visibility is wide, the EL display device has attracted attention as a display portion of a portable equipment used outdoors.

There are two kinds of EL display devices, that is, a passive type (simple matrix type) and an active type (active matrix), and both types have been vigorously developed. Particularly, at present, the active matrix EL display device has attracted a great deal of attention. With respect to the EL material which becomes a luminescent layer emitting EL, there are an organic EL material and an inorganic EL material, and further, the organic EL material is classified into a low molecular (monomer) organic EL material and a high molecular (polymer) organic EL material. Especially, attention has been paid to the polymer organic EL material which is easier to handle and higher in heat resistance than the low molecular organic EL material. Incidentally, a luminous device using the organic EL material is called OLED (Organic Light Emitting Diodes) in Europe.

The active matrix EL display device is characterized in that an electric field effect transistor (hereinafter referred to as FET) is provided in each of pixels constituting a pixel portion, and an amount of electric current made to flow through an EL element is controlled by the FET. However, there has been a problem in that when electrical characteristics of the FETs vary among pixels, luminous characteristics of the EL elements provided in the respective pixels also vary.

SUMMARY OF THE INVENTION

The present invention has been made in view of the above problem and has an object to provide an electronic device in which fluctuation in the luminescence properties of EL elements among pixels is low and color reproducibility is high. Another object of the present invention is to provide a highly reliable electronic device. Further another object of the present invention is to provide an electronic instrument using the electronic device as a display portion.

Still another object of the present invention is to provide a process for reducing the manufacturing cost of the electronic device having high color reproducibility described above.

The present invention is characterized in that for the purpose of suppressing the fluctuation of electrical characteristics of FETs among pixels to a minimum, a single crystal semiconductor substrate is used as a substrate, and an electronic device is formed by using the FET formed on the single crystal semiconductor substrate. Besides, the present invention is characterized in that since the single crystal substrate having such a thickness as to enable formation of the FET does not transmit light, an EL element is formed so that a cathode is directly connected to the FET.

Further, the present invention is characterized in that a plurality of FETs are formed in one pixel, and a structure is optimized in accordance with the role of each FET, so that a highly reliable electronic device is obtained. Specifically, the present invention is characterized in that n-channel FETs are used as a switching element and an electric current controlling element, and arrangements of LDD regions of both are made different from each other.

Moreover, in the present invention, a process of forming a plurality of electronic devices from a large substrate is used to realize a reduction in the manufacturing cost of the electronic device, that is, a reduction of the cost of the electronic device. The present invention is characterized in that the process capable of using the existing liquid crystal line is employed and investment in plant and equipment is suppressed to a minimum, so that a substantial reduction in the manufacturing cost is realized.

BRIEF DESCRIPTION OF THE DRAWINGS

FIGS. 8A and 8B are views showing an EL display device.

DETAILED DESCRIPTION OF THE PREFERRED EMBODIMENTS

Figure 1:
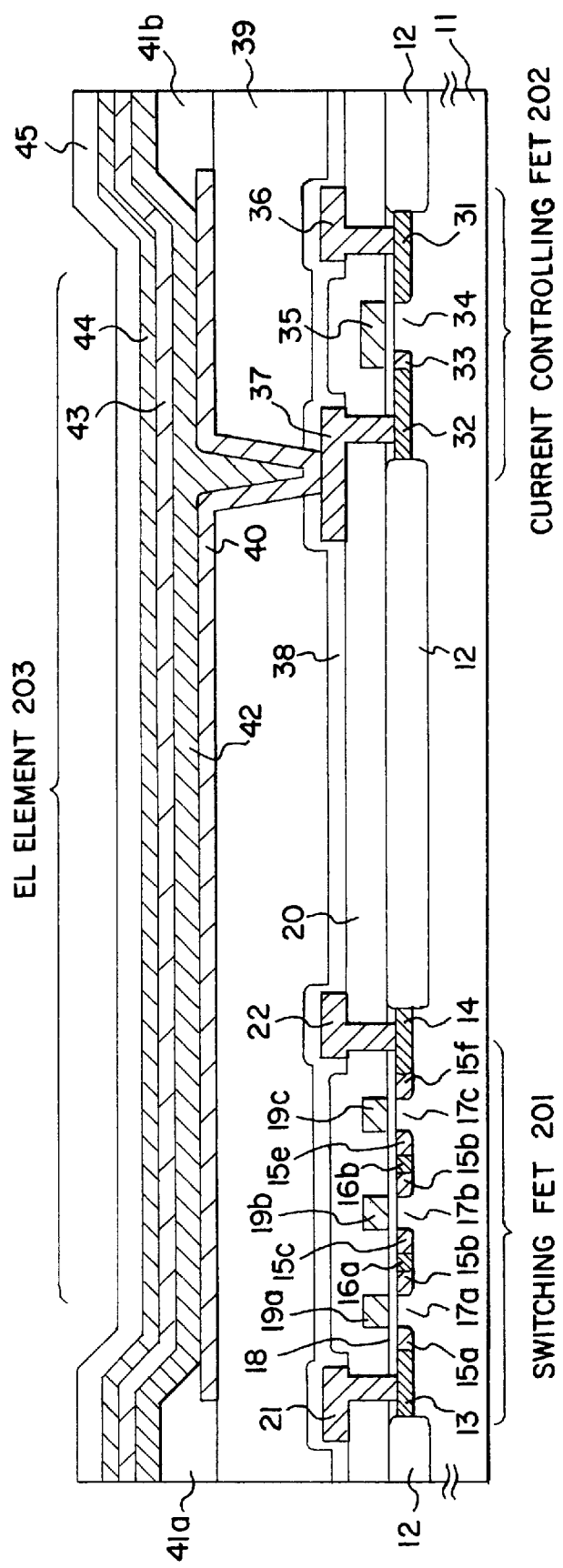
FIG. 1 is a view showing a sectional structure of a pixel portion of an electronic device.
Figure 2A:
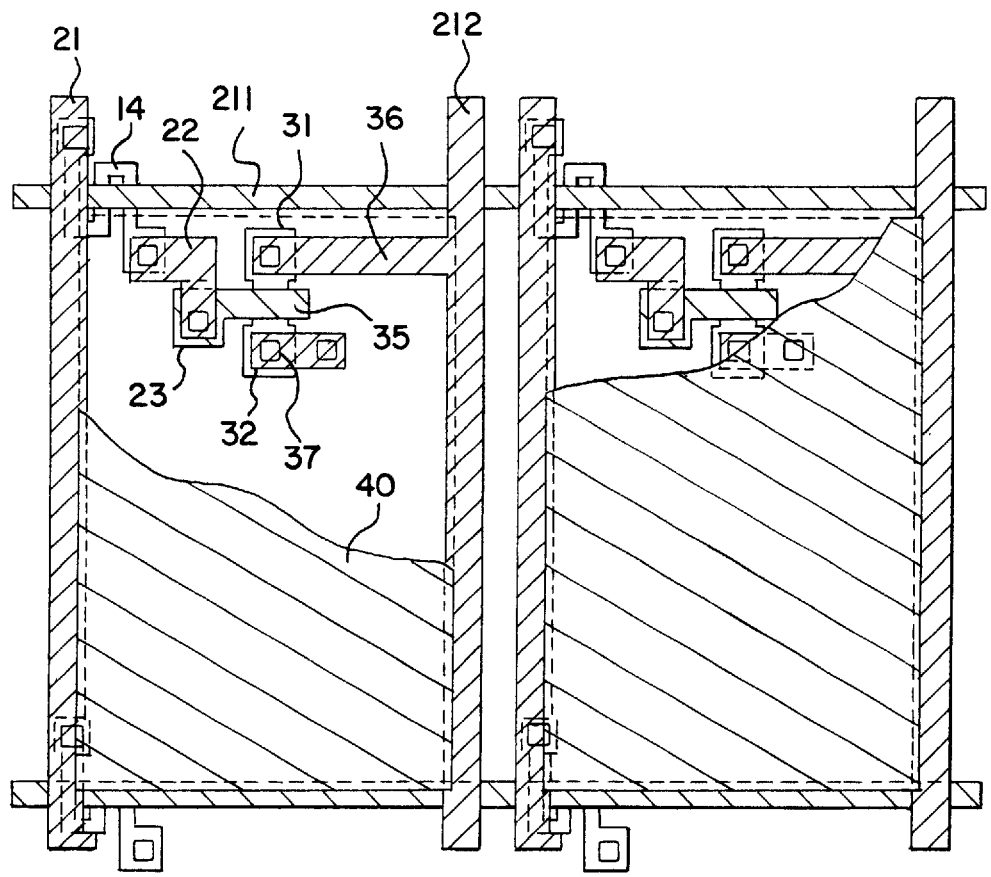
FIGS. 2A and 2B are views showing an upper surface structure of a pixel portion and its constitution.
Figure 2B:
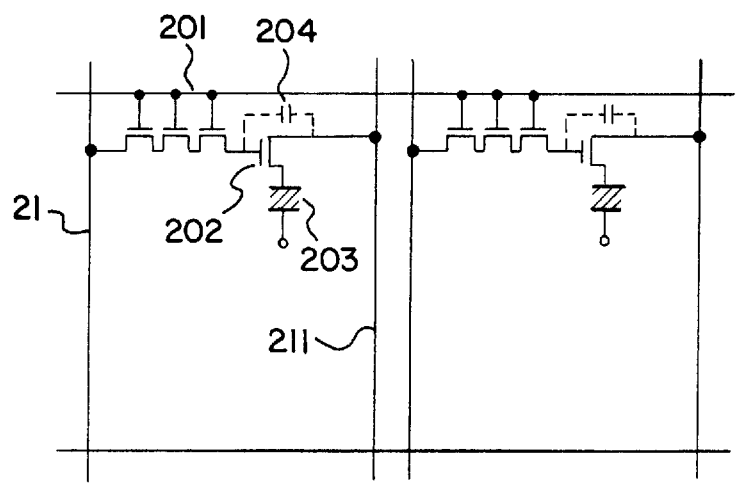

An embodiment mode of carrying out the present invention will be described with reference to FIG. 1 and FIGS. 2A and 2B. FIG. 1 is a sectional view of a pixel portion of an EL display device of the present invention, FIG. 2A is its top view, and FIG. 2B is a view showing its circuit structure.

Actually, a plurality of pixels is arranged in matrix form so that a pixel portion (image display portion) is formed. Incidentally, common symbols are used in FIG. 1 and FIGS. 2A and 2B, both drawings may be suitably referred to. Although the top view of FIGS. 2A and 2B show two pixels, both pixels have the same structure.

In FIG. 1, reference numeral 11 designates a single crystal semiconductor substrate; and 12, an insulating film (hereinafter referred to as field insulating film) for separating elements. As the substrate 11, a single crystal silicon substrate or a single crystal silicon germanium substrate may be used, and both a p-type substrate and an n-type substrate may be used.

Here, two FETs are formed in a pixel. Reference numeral 201 designates an FET (hereinafter referred to as switching FET) functioning as a switching element; and 202, an FET (hereinafter referred to as electric current controlling FET) functioning as an electric current controlling element for controlling an amount of electric current made to flow to an EL element. Both are made of an n-channel FET.

The n-channel FET is advantageous in that it can be formed of an occupied area smaller than that of a p-channel FET in the case where the same amount of electric current is made to flow. In a pixel portion of an EL display device with high fineness, since the size of one pixel becomes as very small as ten and several $\mu$m square, greater flexibility in a design margin can be obtained when the n-channel FET is used.

The p-channel FET has such merits that hot carrier injection becomes hardly a problem and the off current value is low, and examples in which it is used as a switching FET or an electric current controlling FET have been already reported. However, in the present invention, by arrangement of LDD regions, the problem of the hot carrier injection is also solved in the n-channel FET, and FETs in all pixels can be made the n-channel FETs.

However, in the present invention, it is not necessary to limit the switching FET and the electric current controlling FET to the n-channel FET, but it is also possible to use the p-channel FET in both or either one.

The switching FET 201 is constituted by a source region 13, a drain region 14, LDD regions 15a to 15f, high concentration impurity regions 16a and 16b, channel formation regions 17a to 17c, a gate insulating film 18, gate electrodes 19a to 19c, a first interlayer insulating film 20, a source wiring line 21, and a drain wiring line 22. The source region 13, the drain region 14, the LDD regions 15a to 15f, and the high concentration impurity regions 16a and 16b are formed by adding an element in group 15 of the periodic table into the single crystal semiconductor substrate 11.

Besides, as shown in FIG. 2A, the gate electrodes 19a to 19c are part of a gate wiring line 211, and a portion where the gate wiring line 211 overlaps with the channel formation region of the FET is particularly called the gate electrode. Here, the FET of a double gate structure having the two channel formation regions is formed. Of course, in addition to the double gate structure, a so-called multi-gate structure (structure having two or more channel formation regions connected in series with each other) such as a triple gate structure may be adopted.

The multi-gate structure is very effective in lowering the off current value, and in the present invention, the switching FET 201 of the pixel is made the multi-gate structure so that a switching element having the low off current value is realized. Further, in the switching FET 201, the LDD regions 15a to 15f are provided so that they do not overlap with the gate electrodes 19a to 19c through the gate insulating film 18. The structure like this is very effective in lowering the off current value.

Incidentally, it is further preferable in lowering the off current value to provide an offset region (a region which has the same composition as the channel formation region and to which a gate voltage is not applied) between the channel formation region and the LDD region. Besides, in the case of the multi-gate structure having two or more gate electrodes, a high concentration impurity region provided between the channel formation regions is effective in lowering the off current value.

As described above, when the FET of the multi-gate structure is used as the switching FET 201 of the pixel, the off current value can be made sufficiently low. That the off current value is low means that voltage applied to the gate of the electric current controlling FET can be kept for a longer time, and there is obtained a merit that even if a capacitor for holding an electric potential as in FIG. 2 of Japanese Patent Application Laid-open No. Hei 10-189252 is lessened or is omitted, the gate voltage of the electric current controlling FET can be kept until a next writing period.

The electric current controlling FET 202 is constituted by a source region 31, a drain region 32, an LDD region 33, a channel formation region 34, a gate insulating film 18, a gate electrode 35, a first interlayer insulating film 20, a source wiring line 36, and a drain wiring line 37. Incidentally, although the gate electrode 35 has a single gate structure, a multi-gate structure may be adopted.

The drain of the switching FET 201 is connected to the gate of the electric current controlling FET 202. Specifically, the gate electrode 35 of the electric current controlling FET 202 is electrically connected to the drain region 14 of the switching FET 201 through the drain wiring line 22. Besides, the source wiring line 36 is electrically connected to an electric current supply line (also referred to as power supply line) 212 (see FIG. 2A).

The electric current controlling FET 202 is an element for controlling an amount of electric current injected to an EL element 203, and it is not preferable to make a large electric current flow in view of deterioration of the EL element. Thus, it is preferable to design the channel length (L) sufficiently long so that an excessive electric current does not flow through the electric current controlling FET 202. It is desirably designed such that the electric current is 0.5 to 2 $\mu$A (preferably 1 to 1.5 $\mu$A) per pixel.

Figure 6:
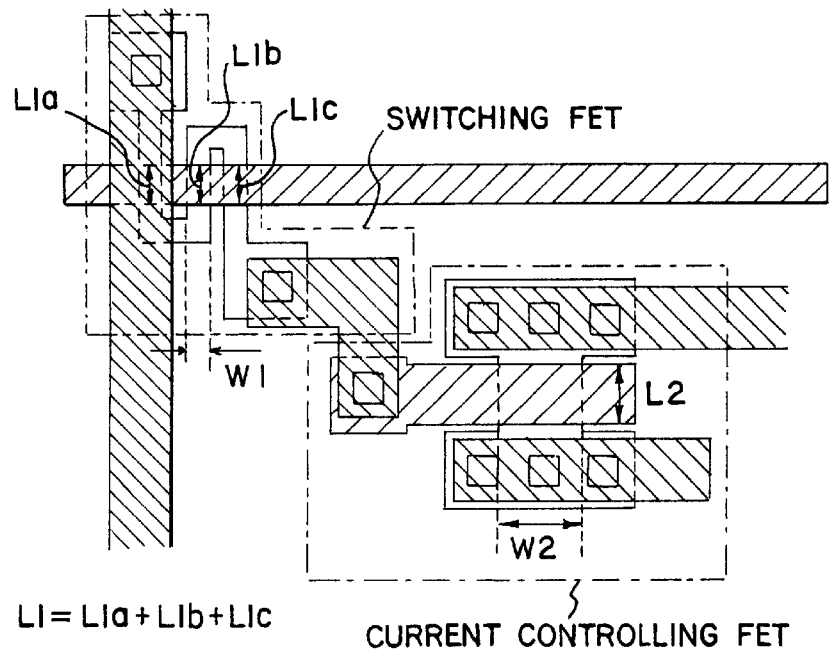
FIG. 6 is an enlarged view of a pixel portion.

Based on the above, as shown in FIG. 6, when a channel length of the switching FET is L1 (L1=L1a+L1b+L1c), a channel width is W1, a channel length of the electric current controlling FET is L2, and a channel width is W2, it is preferable that W1 is made 0.1 to 5 $\mu$m (typically 0.5 to 2 $\mu$m), and W2 is made 0.5 to 10 $\mu$m (typically 2 to 5 $\mu$m). Besides, it is preferable that L1 is made 0.2 to 18 $\mu$m (typically 2 to 15 $\mu$m), and L2 is made 1 to 50 $\mu$m (typically 10 to 30 $\mu$m). However, the present invention is not limited to the above numerical values.

Besides, the length (width) of the LDD region formed in the switching FET 201 may be made 0.5 to 3.5 $\mu$m, typically 2.0 to 2.5 $\mu$m.

Besides, the EL display device shown in FIG. 1 is characterized in that in the electric current controlling FET 202, the LDD region 33 is provided between the drain region 32 and the channel formation region 34, and the LDD region 33 overlaps with the gate electrode 35 through the gate insulating film 18.

Since the electric current controlling FET 202 supplies an electric current for making the EL element 203 emit light, it is preferable to take measures against deterioration due to hot carrier injection as shown in FIG. 1. The arrangement of the LDD region of FIG. 1 is the structure as the measures against the deterioration due to the hot carrier injection. Incidentally, in order to suppress the off electric current as well, it is also effective to make the LDD region overlap with a part of the gate electrode. In this case, a region where it overlaps with the gate electrode suppresses the hot carrier injection, and a region where it does not overlap with the gate electrode suppresses the off current value. Besides, since the direction of flow of carriers (in this case, an electron) in the electric current controlling FET 202 is always the same, if the LDD region 33 is provided only at the side of the drain region 31, it is sufficient for the measures against the hot carrier.

At this time, it is appropriate that the length of the LDD region overlapping with the gate electrode is made 0.1 to 3 μm (preferably 0.3 to 1.5 μm). In the case where the LDD region not overlapping with the gate electrode is provided, it is appropriate that the length is made 1.0 to 3.5 μm (preferably 1.5 to 2.0 μm).

It is also possible to actively use a parasitic capacitance (also referred to as gate capacitance) formed between the gate electrode and an active layer overlapping with the gate electrode through the gate insulating film as a capacitor for electric potential holding (electric charge holding).

In the present embodiment, by forming the LDD region 33 shown in FIG. 1, the gate capacitance between the gate electrode 35 and the active layer (especially the LDD region 33) is made large, and the gate capacitance is used as a capacitor for electric potential holding as in FIG. 2 of Japanese Patent Application Laid-open No. Hei 10-189252. Of course, although a capacitor may be separately formed, when the structure as in this example is adopted, the capacitor for electric potential holding may not be used.

Especially, in the case where the EL display device of the present invention is made to operate in a digital driving system, the capacitor for the electric potential holding may be very small. For example, as compared with an analog driving system, the capacitance may be about ⅕ or about ⅒. The concrete numerical value depends on the performance of the switching FET and the electric current controlling FET so that it can not be generally indicated, but 5 to 30 fF (femtofarad) may be sufficient.

Further, if the structure of the switching FET is made the multi-gate structure as shown in FIG. 1 and the off current value is made small, the capacitance required by the capacitor for electric potential holding becomes further small.

Besides, in the present embodiment, although the electric current controlling FET 202 is shown as a single gate structure, a multi-gate structure in which a plurality of FETs are connected in series with each other may be adopted. Further, such a structure may be adopted that a channel formation region is substantially divided into plural parts by connecting a plurality of FETs in parallel with each other, so that heat radiation can be made at high efficiency. Such a structure is effective as measures against deterioration due to heat.

Reference numeral 38 designates a first passivation film, and its film thickness may be made 10 nm to 1 μm (preferably 200 to 500 nm). As a material, an insulating film containing silicon (especially a silicon nitride oxide film or a silicon nitride film is preferable) can be used. Besides, it is effective to make the first passivation film 38 have a heat radiation effect.

A second interlayer insulating film (flattening film) 39 is formed on the first passivation film 38, so that a stepped portion formed by the FET is flattened. As the second interlayer insulating film 39, an organic resin film is preferable, and polyimide, polyamide, acrylic resin, BCB (benzocyclobutene) or the like may be used. Of course, as long as sufficient flattening can be made, an inorganic film may be used.

It is very important to flatten the stepped portion due to the FET by the second interlayer insulating film 39. Since a subsequently formed EL layer is very thin, there is a case where poor light emission occurs due to the existence of the stepped portion. Thus, it is desirable to make flattening before the pixel electrode is formed so that the EL layer can be formed on the surface as flatly as possible.

Reference numeral 40 designates a pixel electrode (cathode of the EL element) made of a conductive film having high reflectivity and low work function, and after a contact hole (opening hole) is formed in the second interlayer insulating film 39 and the first passivation film 38, it is formed so as to be connected to the drain wiring line 37 of the electric current controlling FET 202 at the formed opening hole portion. As the pixel electrode 40, it is preferable to use the conductive film having low resistance, such as aluminum alloy or copper alloy. Of course, a laminate structure with another conductive film may be used.

Next, an insulating film 41 is formed so as to cover an end portion (corner portion) of the pixel electrode 40. This is because when an organic EL material of a luminescent layer is formed at the end portion of the pixel electrode 40, there is a fear that it is intensively deteriorated by the concentration of an electric field. This insulating film 41 is provided so as to fill a gap between a pixel and a pixel (between a pixel electrode and a pixel electrode).

Next, as a luminescent layer 42, an EL material is formed. As the EL material, although both an inorganic EL material and an organic EL material may be used, the organic EL material having a low driving voltage is preferable. Besides, as the organic EL material, both a low molecular (monomer) organic EL material and a high molecular (polymer) organic EL material may be used.

As the monomer organic material, although $Alq_3$ (tris-8-quinolilite-aluminum) or DSA (distyrylarylene derivative) is typically known, any well-known material may be used.

Besides, as a polymer organic EL material, polyparaphenylene vinylene (PPV) system, polyvinylcarbazole (PVK) system, polyfluorene system or the like can be cited. Of course, any well-known materials may be used. Specifically, cyano polyphenylene vinylene may be used for the luminescent layer emitting red light, polyphenylene vinylene may be used for the luminescent layer emitting green light, and polyphenylene vinylene or polyalkyl phenylene may be used for the luminescent layer emitting blue light. It is appropriate that the film thickness is made 30 to 150 nm (preferably 40 to 100 nm).

Besides, it is also possible to obtain desired light emission by adding a fluorescent material (typically, coumarin 6, rubrene, Nile red, DCM, quinacridone etc.) into the luminescent layer to move the luminescent center to the fluorescent material. Any well-known fluorescent material may be used.

In the case where the monomer organic EL material is used for the luminescent layer 42, it is appropriate that the layer is formed by a vacuum evaporation method. In the case where the polymer organic EL material is used, a spin coating method, a printing method, an ink jet method, or a dispense method may be used. However, when a film of the polymer organic EL material is formed, it is desirable to make a treatment atmosphere an inert gas atmosphere containing the least moisture. For example, the polymer organic EL material is formed by the spin coating method.

Although the polymer organic EL material is formed under ordinary pressure, since the organic EL material is easily deteriorated by the existence of moisture or oxygen, it is necessary to remove such factors to the utmost. For example, a dry nitrogen atmosphere, a dry argon atmosphere, or the like is preferable. For that purpose, it is desirable that a forming apparatus of the luminescent layer is placed in a clean booth filled with an inert gas and a film forming process of the luminescent layer is carried out in the atmosphere.

After the luminescent layer 42 is formed in the manner described above, a hole injection layer 43 is next formed. As the hole injection layer 43, a monomer organic material such as TPD (triphenylamine derivative), CuPc (copper phthalocyanine), or m-MTDATA (starburst amine), or a polymer organic material such as PEDOT (polythiophene), or PAni (polyaniline) is used. Of course, an inorganic material may be used. The film thickness may be 3 to 20 nm (preferably 5 to 15 nm).

However, the above examples are merely examples of the organic materials, which can be used for the luminescent layer or the hole injection layer, and the present invention is not limited to these. Besides, here, although the combination of the luminescent layer and the hole injection layer is shown, in addition, a hole transport layer, an electron injection layer, an electron transport layer, a hole blocking layer, or an electron blocking layer may be combined.

An anode 44 made of a transparent conductive film is provided on the hole injection layer 43. In the case of this mode, since light generated in the luminescent layer 43 is radiated in the direction going away from the FET, the anode must be translucent (transparent). As the transparent conductive film, although a compound of indium oxide and tin oxide or a compound of indium oxide and zinc oxide can be used, since the film is formed after the luminescent layer and the hole injection layer with low heat resistance are formed, it is preferable to use a material enabling film formation at the temperature as low as possible.

The EL element 203 is completed at the point when the anode 44 is formed. Incidentally, the EL element 203 here indicates a capacitor formed of the pixel electrode (cathode) 40, the luminescent layer 42, the hole injection layer 43, and the anode 44. As shown in FIG. 2A, since the pixel electrode 40 is almost coincident with the area of the pixel, the whole pixel functions as the EL element. Thus, usage efficiency of light emission is very high, and clear image display becomes possible.

In this mode, a second passivation film 45 is further provided on the anode 44. As the second passivation film 45, a silicon nitride film or silicon nitride oxide film is preferable. The object is to shut off the EL element from the external, and has both the meaning of preventing deterioration of the organic EL material due to oxidation and the meaning of suppressing degassing from the organic EL material. This can raise the reliability of the EL display device.

Besides, the EL display device of the present invention includes a pixel portion constituted by pixels each having the structure as shown in FIG. 1, and FETs having different structures are arranged in accordance with the role in the pixel. By this, a switching FET having the sufficiently low off current value and an electric current controlling FET resistant to hot carrier injection can be formed in the same pixel, and the EL display device having high reliability and capable of making excellent image display (having high operation performance) can be obtained.

Besides, with respect to fabrication of the FET, since all of conventionally known techniques of the IC and LSI can be used, it is possible to fabricate FETs having less fluctuation in electrical characteristics. By this, it is possible to fabricate the EL display device in which fluctuation in luminescent properties of EL elements is low among pixels, and color reproducibility is high.

[Embodiment 1]

The embodiments of the present invention are explained using FIGS. 3 to 5. A method of simultaneous manufacture of a pixel portion, and FETs of a driver circuit portion formed in the periphery of the pixel portion, is explained here. Note that in order to simplify the explanation, a CMOS circuit is shown as a basic circuit for the driver circuits.

Figure 3A:
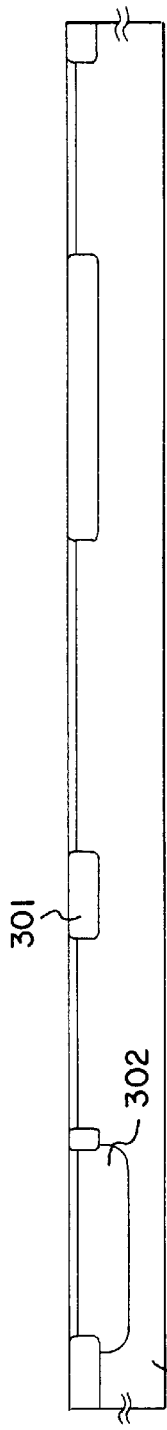
FIGS. 3A to 3D are views showing a fabricating process of an active matrix substrate.

First, as shown in FIG. 3A, a field insulating film 302 is formed on the p-type single crystal silicon substrate 300 with a oxide silicon film by well known LOCOS method (local oxidation of silicon). An impurity element which imparts n-type conductivity (hereinafter referred to as an n-type impurity element) is added and n-well 302 is formed. Note that elements residing in periodic table group 15 are generally used as the n-type impurity element, and typically phosphorous or arsenic can be used.

Figure 3B:
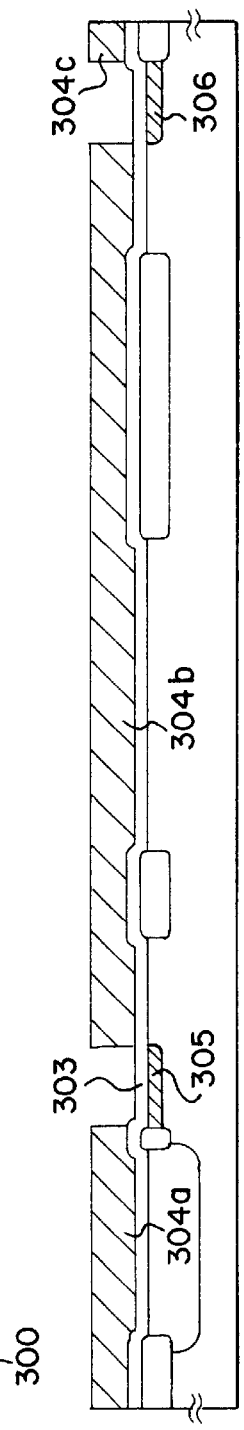

Next, as shown in FIG. 3B, a protecting film 303 is formed with a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is formed so that the single crystal silicon film is not directly exposed to plasma during addition of an impurity, and so that it is possible to have delicate concentration control of the impurity.

Resist masks 304a to 304c are then formed, and an n-type impurity element is added via the protecting film 303. Note that a plasma doping method is used, in which phosphine ($PH_3$) is plasma activated without separation of mass, and phosphorous is added at a concentration of $1\times10^{18}$ atoms/cm$^3$ in this embodiment. An ion implantation method, in which separation of mass is performed, may also be used, of course.

The dose amount is regulated so that the n-type impurity element is contained in n-type impurity regions 305, 306, thus formed by this process, at a concentration of $2\times10^{16}$ to $5\times10^{19}$ atoms/cm$^3$ (typically between $5\times10^{17}$ and $5\times10^{18}$ atoms/cm$^3$).

Figure 3C:

Next, as shown in FIG. 3C, resist masks 304a to 304c and the protect film 303 are removed, and a gate insulating film 307 is formed by performing the thermal oxidation method. At the time, the activation of the added n-type impurity element is performed. The oxidation time and oxidation temperature is regulated to form the thermal oxidation film into 30 to 80 nm thickness (preferably 40 to 60 nm).

This process clarifies the edge of the n-type impurity regions 305, 306, namely, the boundary (junction) between the n-type impurity regions 305, 306 and the region around the n-type impurity regions 520, 521, where the n-type impurity element is not added. This means that the LDD region and the channel formation region can form an excellent junction when a TFT is later completed.

Figure 3D:
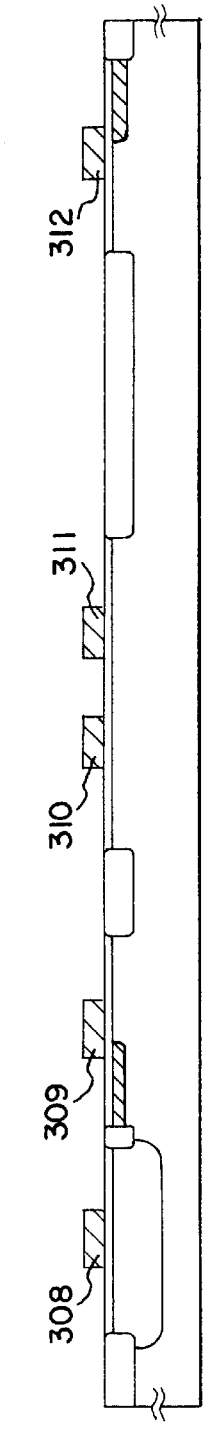

Next, a conducting film with a thickness of 200 to 400 nm is formed next and patterned, forming gate electrodes 308 to 312 as shown in FIG. 3D. Further, the gate wirings may be formed by a single layer conducting film, and when necessary, it is preferable to use a two layer or a three layer lamination film. All known conducting films can be used as the gate electrode material. However, as stated above, it is preferable to use a material which is capable of being micro-processed, specifically, a material which is capable of being patterned to a line width of 2 μm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film, titanium silicide film). Of course, the films may be used as a single layer or a laminate layer.

In this embodiment, a laminate film of a tungsten nitride (WN) film having a thickness of 30 nm and a tungsten (W) film having a thickness of 370 nm is used. These may be formed by a sputtering method. When an inert gas of Xe, Ne or the like is added as a sputtering gas, film peeling due to stress can be prevented.

The gate electrodes 309 and 312 are formed at this time so as to overlap a portion of the n-type impurity regions 305, 306 with the gate insulating film 311 interposed therebetween. This overlapping portion later becomes an LDD region to suppress the injection of hot carriers.

Figure 4A:
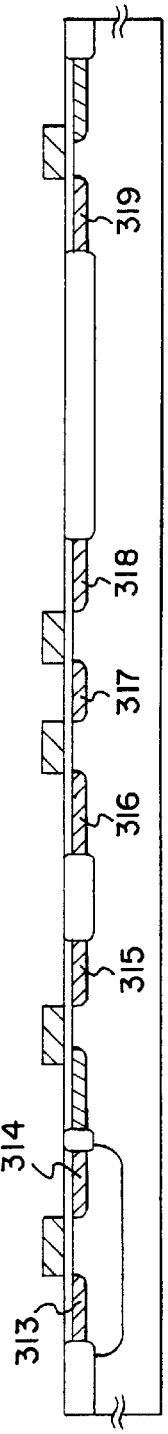
FIGS. 4A to 4D are views showing the fabricating process of the active matrix substrate.

Next, an n-type impurity element (phosphorus is used in this embodiment) is added in a self-aligning manner with the gate electrodes 308 to 312 as masks, as shown in FIG. 4A. The addition is regulated so that phosphorous is added to impurity regions 313 to 319 thus formed at a concentration of 1/10 to 1/2 that of the n-type impurity regions 305, 306, (typically between 1/4 and 1/3). Specifically, a concentration of $1 \times 10^{16}$ to $5 \times 10^{18}$ atoms/cm$^3$ (typically $3 \times 10^{17}$ to $3 \times 10^{18}$ atoms/cm$^3$) is preferable.

Figure 4B:
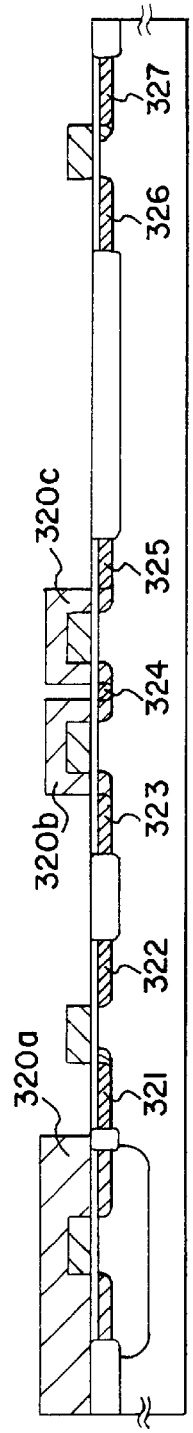

Resist masks 320a to 320c are formed next as shown in FIG. 4B, and an n-type impurity element (phosphorous is used in this embodiment) is added, forming impurity regions 321 to 327 containing a high concentration of phosphorous. Ion doping using phosphine (PH$_3$) is also performed here, and is regulated so that the phosphorous concentration of these regions is from $1 \times 10^{20}$ to $1 \times 10^{21}$ atoms/cm$^3$ (typically between $2 \times 10^{20}$ and $5 \times 10^{20}$ atoms/cm$^3$).

A source region or a drain region of the n-channel FET is formed by this process, and in the switching FET, a portion of the n-type impurity regions 316 to 318 formed by the process of FIG. 4A remains. These remaining regions correspond to the LDD regions 15a to 15f of the switching FET in FIG. 1.

Figure 4C:
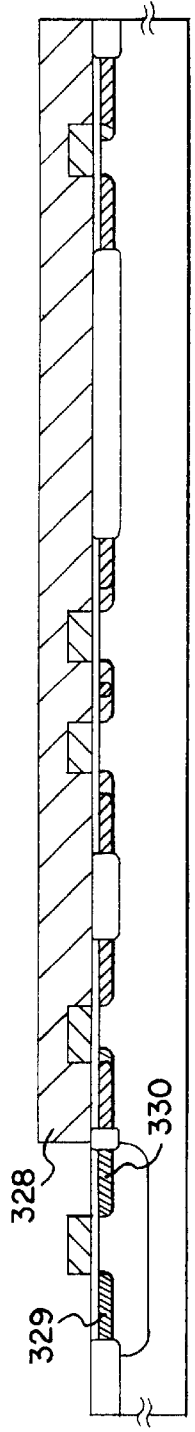

Next, as shown in FIG. 4C, the resist masks 320a to 320c are removed, and a new resist mask 328 is formed. A p-type impurity element (boron is used in this embodiment) is then added, forming impurity regions 329 to 330 containing a high concentration of boron. Boron is added here to form impurity regions 333 and 334 at a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane (B$_2$H$_6$).

Note that phosphorous has already been added to the impurity regions 329 to 330 at a concentration of $1 \times 10^{20}$ to $1 \times 10^{21}$ atoms/cm$^3$, but boron is added here at a concentration of at least 3 times than of the phosphorous. Therefore, the n-type impurity regions already formed completely invert to p-type, and function as p-type impurity regions.

Next, after removing the resist mask 328, the n-type and p-type impurity elements added at various concentrations are activated. Furnace annealing, laser annealing, or lamp annealing may be performed as a means of activation. Heat treatment is performed in this embodiment in a nitrogen atmosphere for 1 hours at 800° C. in an electric furnace.

Before performing the above mentioned activation, the gate insulating film 307 is removed in a self aligning manner as the gate electrodes 308 to 312 as masks. The well-known salicide process is performed, and a silicide layer can be formed on the source region and the drain region of FET. At this time, the thermal process can be performed moreover to form the silicide layer at the above mentioned activation.

Figure 4D:
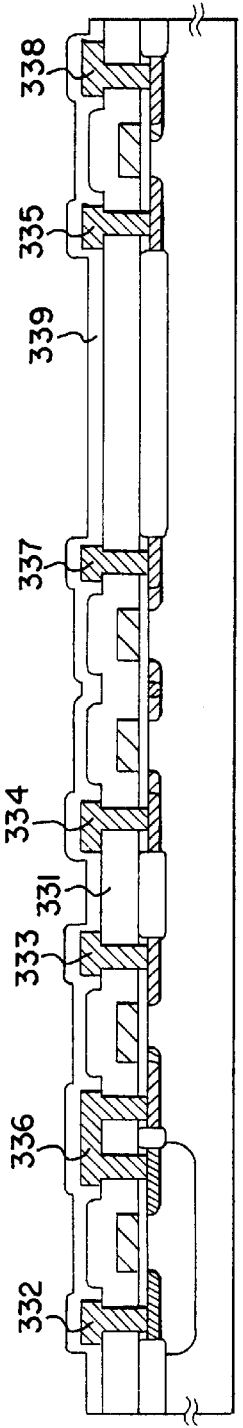

A first interlayer insulating film 331 is formed next, as shown in FIG. 4D. A single layer insulating film containing silicon is used as the first interlayer insulating film 331, while a lamination film may be combined in between. Further, a film thickness of between 400 nm and 1.5 μm may be used. A lamination structure of an 800 nm thick silicon oxide film on a 200 nm thick silicon nitride oxide film is used in this embodiment.

In addition, heat treatment is performed for 1 to 12 hours at 300 to 450° C. in an environment containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 331. Namely, hydrogen processing may be performed as above after forming the 200 nm thick silicon nitride oxide film, and then the remaining 800 nm thick silicon oxide film may be formed.

Next, a contact hole is formed in the first interlayer insulating film 331, and source wiring lines 332 to 335 and drain wiring lines 336 to 338 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 339 is formed next with a thickness of 50 to 500 nm (typically between 200 and 300 nm). A 300 nm thick silicon nitride oxide film is used as the first passivation film 339 in this embodiment. This may also be substituted by a silicon nitride film. Note that it is effective to perform plasma processing using a gas containing hydrogen such as H$_2$ or NH$_3$ etc. before the formation of the silicon nitride oxide film. Hydrogen activated by this preprocess is supplied to the first interlayer insulating film 331, and the film quality of the first passivation film 339 is improved by performing heat treatment. At the same time, the hydrogen added to the first interlayer insulating film 331 diffuses to the lower side, and the active layers can be hydrogenated effectively.

Figure 5A:
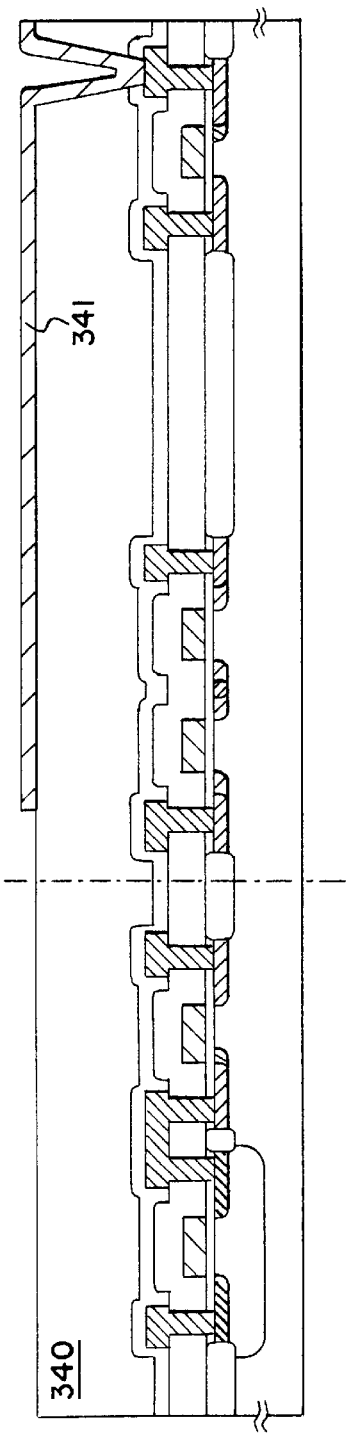
FIGS. 5A and 5B are views showing the fabricating process of the active matrix substrate.

Next, as shown in FIG. 5A, a second interlayer insulating film 340 made of organic resin is formed. As the organic resin, it is possible to use polyimide, polyamide, acryl, BCB (benzocyclobutene) or the like. Especially, since the second interlayer insulating film 340 is primarily used for flattening, acryl excellent in flattening properties is preferable. In this embodiment, an acrylic film is formed to a thickness sufficient to flatten a stepped portion formed by FETs. It is appropriate that the thickness is preferably made 1 to 5 μm (more preferably, 2 to 4 μm).

A contact hole reaching a drain wiring line 338 is formed through the second interlayer insulating film 340 and the first passivation film 339 and a pixel electrode 341 is formed. In this embodiment, as a pixel electrode 341, as aluminum alloy film of 300 nm thickness (an aluminum film contains 1 wt % titanium).

Figure 5B:
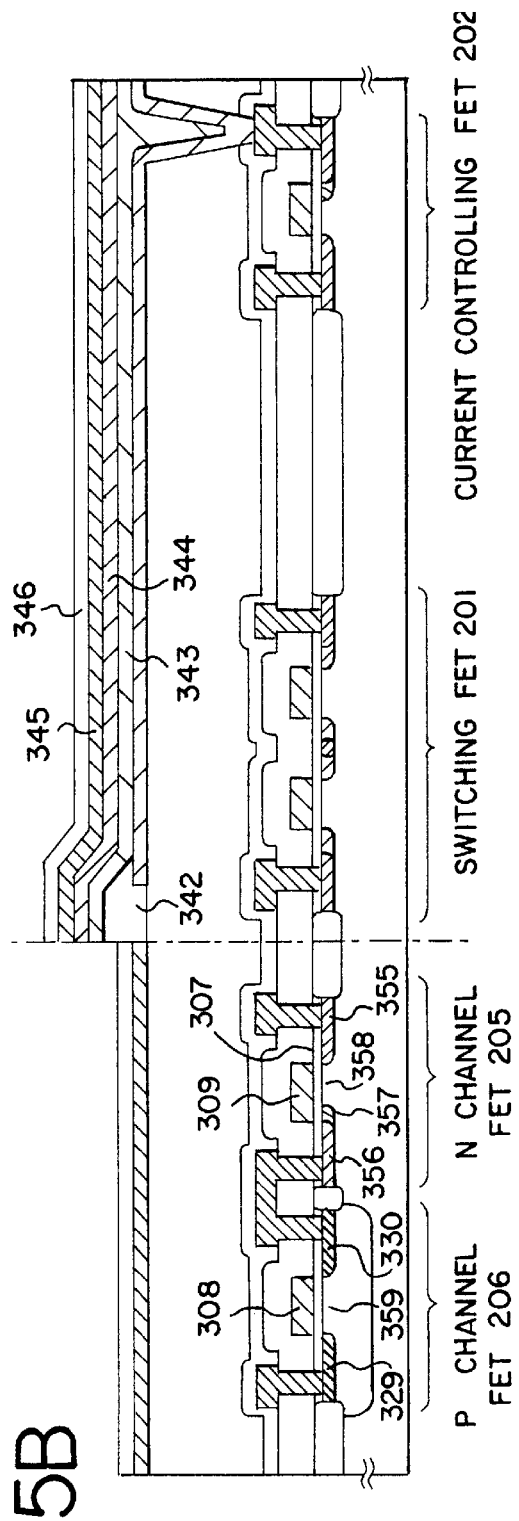

Next, an insulating film 342 is formed as shown in FIG. 5B. The insulating film 342 is formed by patterning the organic resin film or the insulating film contains 10~300 nm thick silicon. This insulating film 342 is formed to fill the space between pixels (pixel electrodes). This insulating film 342 is formed for organic EL material, which is formed next, of luminescence layer not to overlap the edge portion of pixel electrode 341.

A light-emitting layer 343 is next formed by the spin coating method. Specifically, an organic EL material that becomes the light-emitting layer 343 is dissolved in a solvent such as chloroform, dichloromethane, xylene, toluene, and tetrahydrofuran, and is then applied. Thereafter, heat treatment is performed to volatilize the solvent. A film (light-emitting layer) made of the organic EL material is thus formed. In this embodiment, a paraphenylene vinylene is used for the light-emitting layer luminescing green color. The light-emitting layer is formed to a thickness of 50 nm. In addition, 1.2-dichloromethane is used as a solvent, and then volatilized by performing heat treatment on a hot plate at 80 to 150° C. for 1 minute.

Next, a hole injection layer 344 is formed to a thickness of 20 nm. Since the hole injection layer 344 may be provided commonly for all the pixels, it is appropriate to form the hole injection layer 349 by utilizing the spin coating method. In Embodiment 1, polythiophene (PEDOT) is applied as a solution, and heat treatment is performed on a hot plate at 100 to 150° C. for 1 to 5 minutes to thereby volatilize its moisture. In this case, the hole injection layer 349 can be formed without dissolving the light-emitting layer 348 because polyphenylene vinylene is insoluble.

As a hole injection layer 344, other polymer organic material and monomer organic material can be used. In the case of using monomer organic material, evaporation method can be used to form a hole injection layer 344. The inorganic material can also be used.

A two-layered structure made of the light-emitting layer and the hole injection layer is formed in this embodiment. However, other layers such as a hole transporting layer, an electron injection layer, and an electron transporting layer may also be provided. Examples of various lamination structures of such combination of layers have been reported, and any structure may be used for the present invention.

After the formation of the light-emitting layer 343 and the hole injection layer 344, an anode 345 made of a small work function transparent conductive film is formed to a thickness of 120 nm. Indium oxide, which is doped with 10 to 20 wt % of zinc oxide, is used for the transparent conductive film in this embodiment. As the film deposition method, it is preferable to use a evaporation method at room temperature so that the light-emitting layer 343 and the hole injection layer 344 are not deteriorated.

A second passivation film 346 made of a silicon oxide nitride film is formed to a thickness of 300 nm by plasma CVD after the formation of the anode 345. At this point, it is also necessary to pay attention to the film deposition temperature. The remote plasma CVD may be employed to lower the film deposition temperature.

An active matrix substrate having a structure as shown in FIG. 5B is thus completed. Note that after the formation of the insulating film 342, it is effective to use the multi-chamber method (or the in-line method) of the thin film deposition apparatus for the process of forming the films until the formation of the passivation film 346, in succession and without exposure to the atmosphere.

In the active matrix substrate of this embodiment, FETs having optimal structures are arranged not only in the pixel portion but also in the driver circuit portion, thereby indicating an extremely high reliability and increasing its operation performance.

First, a FET having a structure to decrease hot carrier injection so as not to drop the operation speed thereof as much as possible is used as an n-channel FET 205 of a CMOS circuit forming a driver circuit portion. Note that the driver circuit here includes a shift register, a buffer, a level shifter, a sampling circuit (sample and hold circuit), a D/A converter and the like. In the case of this embodiment, as shown in FIG. 5B, an active layer of the n-channel FET 205 is composed of a source region 355, a drain region 356, an LDD region 357, and a channel forming region 358. The LDD region 357 overlaps the gate electrode 309 via the gate insulating film 307. This structure is identical to the structure of the current control FET 202.

Consideration not to drop the operation speed is the reason why the LDD region is formed at only the drain region side. In this n-channel FET 205, it is not necessary to pay attention to an OFF current value very much, rather, it is better to give importance to an operation speed. Thus, it is desirable that the LDD region 357 is made to completely overlap the gate electrode to decrease a resistance component to a minimum.

The p-channel FET 206 in the CMOS circuit includes the source region 329, the drain region 330 and the channel formation region 359. Furthermore, deterioration due to the injection of hot carriers is almost negligible, and thus, it is not necessary to provide any LDD region especially, but it is also possible to provide.

Note that, in practice, it is preferable to additionally perform packaging (sealing) after completing up through FIG. 5B by using a highly airtight protective film which has very little gas leakage (such as a laminate film or an ultraviolet cured resin film) or a sealing material that is transmissive, so that there is no exposure to the atmosphere. By making the inside of the sealing material an inert environment, an inert liquid material and an inert solid material and by placing a drying agent (for example, barium oxide) within the sealing material, the reliability of the EL element is increased.

Furthermore, after the airtightness is increased by the packing processing etc., a connector (a flexible printed circuit, FPC) for connecting output terminals from elements or circuits formed on the substrate and external signal terminals, is attached, completing a electronic equipment using EL element. The electronic equipment of this specification includes a connector for input a signal from outside and integral circuit which is connected to the connector.

Figure 7:
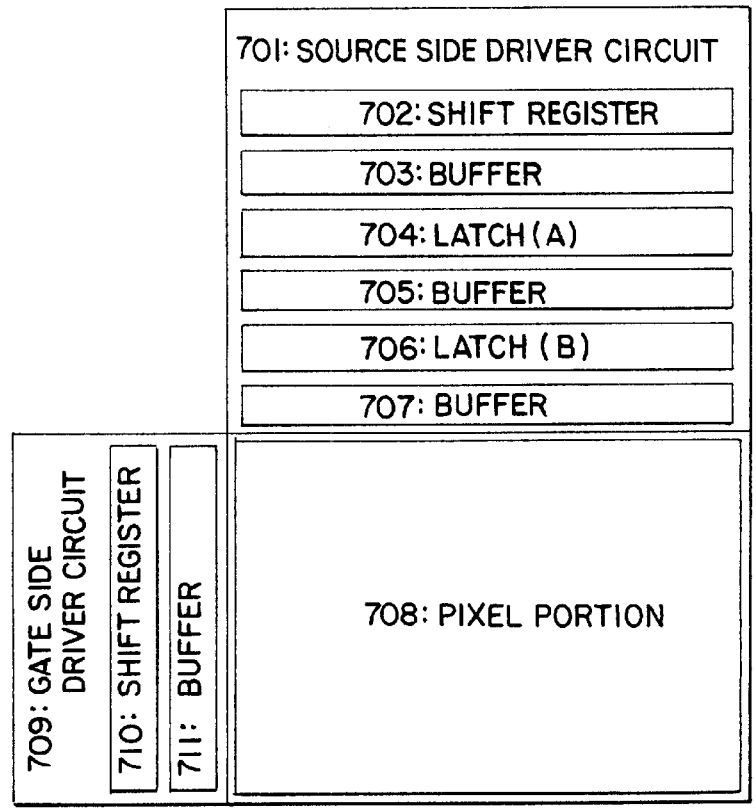
FIG. 7 is a view showing a circuit structure of an EL display device.

Here, the example of circuit structure of the EL display device of this embodiment will be described with reference in FIG. 7. The EL display device of this embodiment is constituted by a source side driver circuit 701, a pixel portion 708, and a gate side driver circuit 709. Further, in this embodiment, the driver circuit portion is a general term including the source side processing circuit and the gate side driver circuit.

In this embodiment, an n-channel FET having multi gate structure is provided as a switching FET in the pixel portion 708, the switching FET is arranged to the intersection of gate wiring and source wiring which is connected to the gate side driver circuit 709 and the source side driver circuit 701 respectively. Further, the drain of the switching FET is connected to the gate of type current control FET electrically.

The source side driver circuit 701 is provided with a shift register 702, a buffer 703, a latch (A) 704, a buffer 705, a latch (B) 706 and a buffer 707. Further, in the case of analog driver, the sampling circuit is provided instead of a latch (A) and a latch (B). The gate side driver circuit 709 is provided with a shift register 710, and a buffer 711.

Further, not shown in the figure, the gate side driver circuit can be provided moreover at the opposite side of the gate driver circuit 709 via the pixel portion 708. In this case, the both side own jointly gate wirings in the same structure, if the one is destroyed, the other one send a gate signal to operate a pixel portion correctly.

The foregoing structure can be easily realized by manufacturing FETs in accordance with the manufacturing processes shown in FIGS. 3 to 5. In this embodiment, although only the structure of the pixel portion and the driver circuit portion is shown, if the manufacturing processes of this embodiment are used, it is possible to form a logical circuit, such as a signal dividing circuit, a D/A converter circuit, an operational amplifier circuit, a γ-correction circuit, on the same substrate, and further, it is considered that a memory portion, a microprocessor, or the like can be formed.

Furthermore, an explanation of the EL display device of this embodiment, after containing the sealing material to protect an EL element, is made using FIGS. 8A and 8B. Note that, when necessary, the symbols used in FIG. 7 is cited.

FIG. 8A is a diagram showing the top view of a state of complete sealing process to protect the EL element. Indicated by dotted lines, reference numeral 701 denotes a source side driver circuit, 708 denotes a pixel portion, 709 denotes a gate side driver circuit. Reference numeral 801 denotes a cover material, 802 denotes a first seal member, 803 denotes a second seal member and a filling material (not shown in the figure) is provided between an active matrix substrate and inside cover material 801 which is enclosed by the first seal member 802.

Further, reference numeral 804 denotes a connection wiring to transmit the signal which is input to the source side driver circuit 701 and the gate side driver circuit 709. The connection wiring accepts a video signal and clock signal from a outside input terminal FPC 805.

Here, the cross-sectional view taken along line A—A of FIG. 8A is shown in FIG. 8B. It is to be noted that the same reference numerals are used for the same components in FIGS. 8A and 8B.

As shown in FIG. 8B, the pixel portion 708 and the gate side driver circuit 709 are formed on the single crystal silicon substrate. The pixel portion 708 is formed of a plurality of pixels including the current control FET 202 and the pixel electrode 341 which is electrically connected to the drain of the current control FET 202. Further, the gate side driver circuit 709 is formed by using a CMOS circuit that is a complementary combination of the n-channel FET 205 and the p-channel FET 206.

The pixel electrode 341 functions as the cathode of the EL element. In addition, the insulating film 342 is formed on both ends of the pixel electrode 341, and the light-emitting layer 343 and the hole injection layer 344 are formed. The anode 345 of the EL element and the second passivation film 346 are further formed on the top.

In the case of this embodiment, the anode 345 also functions as a common wiring to all the pixels, and is electrically connected to the FPC 805 through the connection wiring 804. Furthermore, all the elements contained in the pixel portion 708 and the gate side driver circuit 709 are covered by the second passivation film 346. The second passivation film 346 can be omitted, however it is preferable to provide for shielding from outside.

Next, after forming a first seal member 802 by a dispenser, scattering a spacer (not shown in the figure) to glue a cover material 801. The spacer is scattered to maintain the distance between an active matrix substrate and cover material 801. And, the filling material 807 is filled inside of the first seal member 802 by a vacuum injecting method. In the foregoing process, the technique, which is used in a cell assembling process of liquid crystal display, can be used. It is preferable to use a photo curing resin as the first seal member 802, but a thermally curable resin may also be used provided that the thermal resistance of the EL layer permits. Note that it is preferable that the first seal member 802 be a material through which as little moisture and oxygen as possible are transmitted. Further, a drying agent may also be added to the inside of the first seal member 802.

Next, a filling material 807 is provided so as to cover the EL element. The filling material 807 also functions as an adhesive for gluing the cover material 801. As the filling material 807, polyimide, acryl, PVC (polyvinyl chloride), epoxy resins, silicon resins, PVB (polyvinyl butyral) or EVA (ethylene vinyl acetate) can be used.

It is preferable to place a drying agent (not shown in the figure) inside the filling material 807 because the absorbent effect can be maintained. At this point, the drying agent may be an agent doped into the filling material, or an agent enclosed in the filling material. Further, as above-mentioned spacer (not shown in the figure), it is effective to use an absorbent material. However, a material having transmissivity is used in the case of this embodiment to thereby emit light from the side of the filling material 807.

Further, in this embodiment, a glass plate, a quartz plate, a plastic plate, a ceramic plate, an FRP (Fiberglass-Reinforced Plastics) plate, PVF (polyvinyl fluoride) film, a milar film, a polyester film, or an acrylic film can be used as the cover material 801. In this embodiment, the cover material 801 must have transmissivity same as filling material.

After using the filling material 807 to glue the cover material 801, the second seal member 803 is next attached so as to cover a side surface (the exposed surface) of the first seal member 802. The second seal member 803 can use the same material as the first seal member 802.

The EL element is thus sealed into the filling material 807 by using the above procedure, to thereby completely cut off the EL element from the external atmosphere and to prevent the penetration of substances such as moisture and oxygen from the outside which stimulate the deterioration of the EL element due to the oxidation of the EL layer. Accordingly, highly reliable EL display devices can be manufactured.

[Embodiment 2]

In this embodiment, an example of a case in which a pixel constitution shown in FIG. 9 differs from that of the circuit diagram (constitution) shown in FIG. 2B. Note that in this embodiment, reference numeral 901 denotes source wiring of a switching FET 902, 903 denotes a gate wiring of a switching FET 902, 904 denotes a current control FET, 905 denotes a capacitor, 906 and 908 denote electric current supply lines, and 907 denotes an EL element.

It is to be noted that the capacitor 905 employs for maintenance of electric potential of a gate capacitance of the current control FET 904. Substantially, the capacitor 905 is not provided, and therefore it is indicated by a dotted line.

Figure 9A:
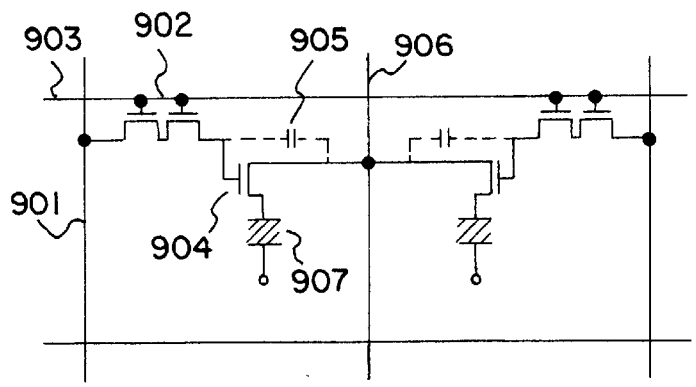
FIGS. 9A to 9C are views showing circuit structures of pixels.

FIG. 9A is an example of a case in which the electric current supply line 906 is common between two pixels. Namely, this is characterized in that the two pixels are formed having linear symmetry around the electric current supply line 906. In this case, the number of the electric current supply line can be reduced, and therefore the pixel portion can be made with higher definition.

Figure 9B:
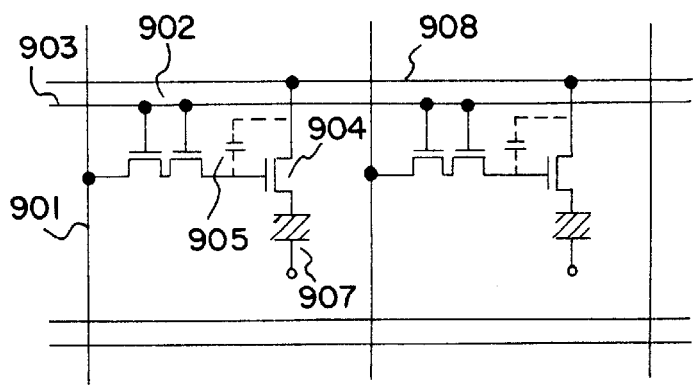

Further, FIG. 9B is an example of a case in which the electric current supply line 908 is formed parallel to the gate wiring 903. Note that in FIG. 9B, the structure is formed such that the electric current supply line 908 and the gate wiring 903 not to overlap. If both lines are formed in different layer respectively, they can be formed to overlap through an insulating film. In this case, the exclusive surface area can be shared by the electric current supply line 908 and the gate wiring 903, and the pixel portion can be made with higher definition.

Figure 9C:
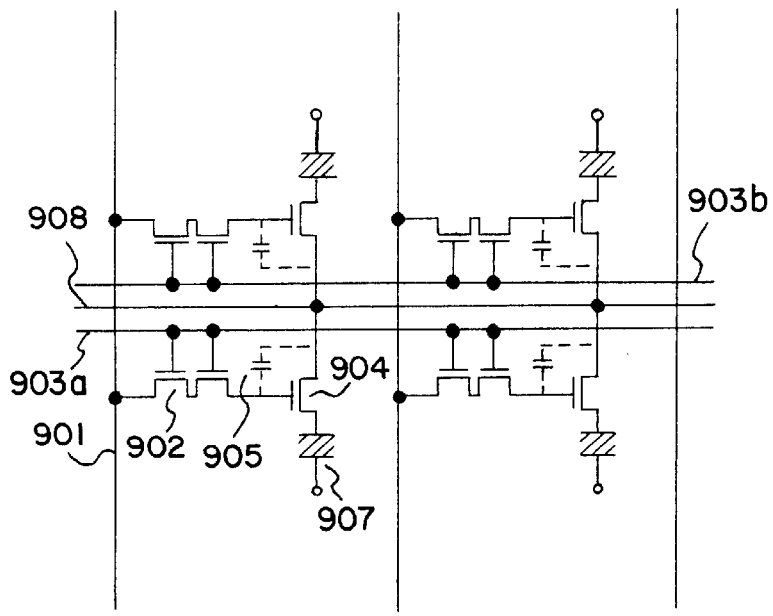

Furthermore, FIG. 9C is characterized in that the electric current supply line 908 and the gate wiring 903$a$, 903$b$ are formed in parallel, similar to the structure of FIG. 9B, and additionally, in that the two pixels are formed so as to have linear symmetry around the electric current supply line 908. In addition, it is effective to form the electric current supply line 908 so as to overlap with one of the gate wirings 903$a$, 903$b$. In this case, the number of electric current supply lines can be reduced, and therefore the pixel portion can be made with higher definition.

In addition, it is effective to employ the EL display device having the pixel structure of this embodiment as the display portion of the electronic equipment of Embodiment 1.

[Embodiment 3]

In this embodiment, examples in which the element structure of the electric current controlling FET 202 shown in FIG. 1 is made a different one, will be described with reference to FIGS. 10A to 10D. Specifically, examples in which the arrangement of the LDD region is made a different one, will be described. Incidentally, the same portions as those of the electric current controlling FET 202 shown in FIG. 1 are designated by the same symbols.

Figure 10A:
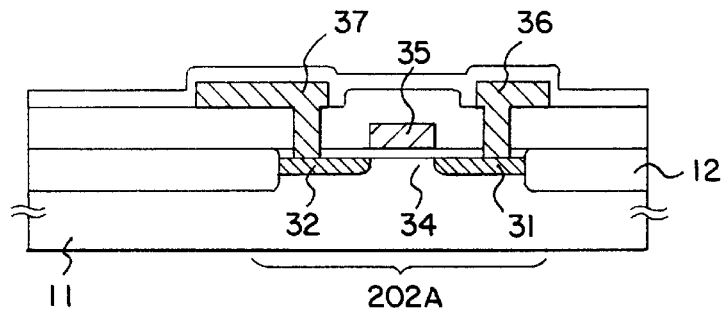
FIGS. 10A to 10D are views showing sectional structures of electric current controlling FETs.

An electric current controlling FET 202A shown in FIG. 10A is an example in which the LDD region 33 is omitted from the electric current controlling FET 202 shown in FIG. 1. In the case shown in FIG. 1, since the switching FET 201 has a triple-gate structure, an off current value is very small, and if a digital driving system is used, the capacitance of a capacitor for holding the electric potential of the gate of the electric current controlling FET 202A may be very small.

Thus, as shown in FIG. 10A of this embodiment, it is possible to hold the electric potential of the gate of the electric current controlling FET 202A only by a gate capacitance formed between a gate electrode 35 and a drain region 32.

Figure 10B:
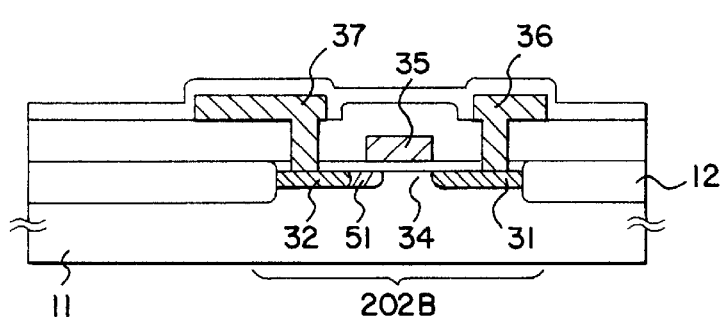

Next, an electric current controlling FET 202B shown in FIG. 10B is an example in which a gate electrode 35 overlaps with a part of an LDD region 51 through a gate insulating film. In this case, a portion of the LDD region 51 not overlapping with the gate electrode 35 functions as a resistor so that it has an effect of decreasing the off current value. That is, by making the structure of FIG. 10B, it is possible to realize both suppression of deterioration due to hot carrier injection and lowering of the off electric current value at the same time.

Figure 10C:
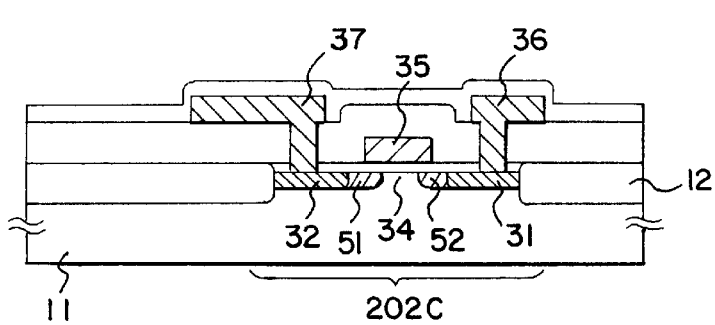

Next, an electric current controlling FET 202C shown in FIG. 10C is an example in which the LDD region 51 shown in FIG. 10B is provided at not only the side of the source region 31 but also at the side of the drain region 32. In this embodiment, an additional region is made an LDD region 52. Such a structure is an effective structure in the case where the direction of flow of electrons is changed (source region and drain region are inverted) like a sampling circuit used in an analog driving system.

Thus, it is also possible to use the structure of FIG. 10C for a switching FET. Also in that case, it is possible to realize both the suppression of deterioration due to the hot carrier injection and the lowering of the off current value at the same time.

Figure 10D:
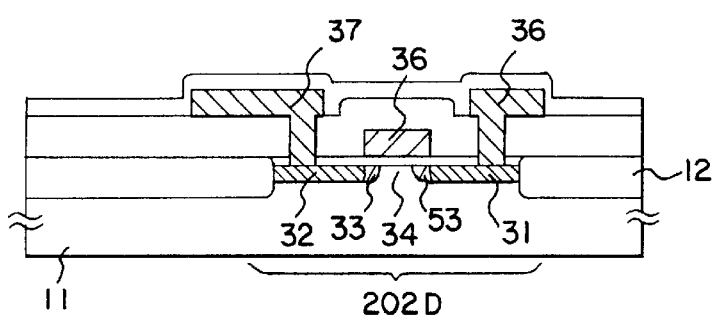

Next, an electric current controlling FET 202D shown in FIG. 10D is an example in which the LDD region 33 shown in FIG. 1 is provided at both the side of the source region 31 and the side of the drain region 32. In this embodiment, an additional region is made an LDD region 53. Such a structure is an effective structure in the case where the direction of flow of electrons is changed like a sampling circuit used in an analog driving system.

Incidentally, any of the structures of this embodiment can be substituted for the electric current controlling FET 202 of the embodiment 1, and can also be combined with the embodiment 2.

[Embodiment 4]

In this embodiment, a description will be made on a case where a plurality of EL display devices of the present invention are fabricated by using a large substrate (large wafer). Top views of FIGS. 11A to 13F are used for the description. Incidentally, sectional views taken along line A–A' and B–B' are also shown in the respective top views. In particular, for FIG. 11A, the sectional view taken along line A–A' is shown in FIG. 11B and the sectional view taken along line B–B' is shown in FIG. 11C. For FIG. 11D, the sectional view taken along line A–A' is shown in FIG. 11E and the sectional view taken along line B–B' is shown in FIG. 11F. For FIG. 12A, the sectional view taken along line A–A' is shown in FIG. 12B and the sectional view taken along line B–B' is shown in FIG. 12C. For FIG. 12D, the sectional view taken along line A–A' is shown in FIG. 12E and the sectional view taken along line B–B' is shown in FIG. 12F. For FIG. 13A, the sectional view taken along line A–A' is shown in FIG. 13B and the sectional view taken along line B–B' is shown in FIG. 13C. For FIG. 13D, the sectional view taken along line A–A' is shown in FIG. 13E and the sectional view taken along line B–B' is shown in FIG. 13F.

Figure 11A:
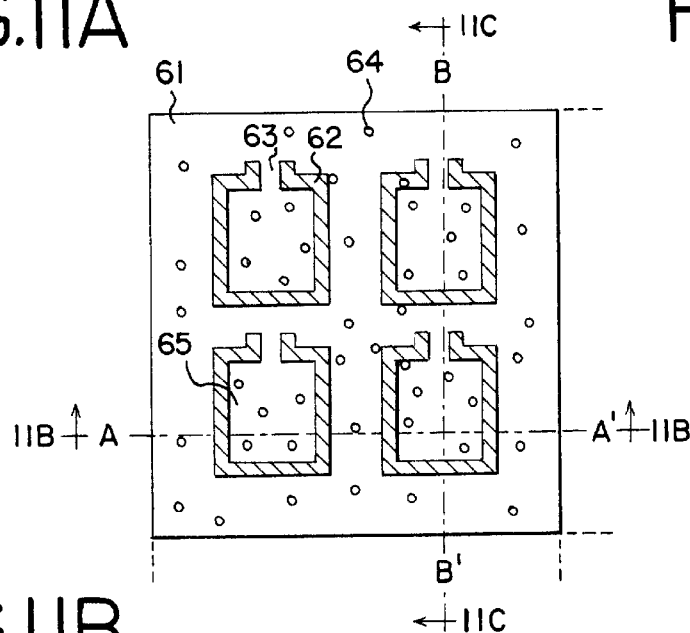
FIGS. 11A–11F are views showing a process of obtaining multiple number of EL display devices.
Figure 11C:
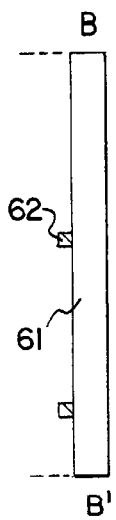
Figure 11B:
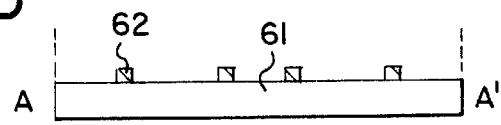

FIG. 11A is a view showing a state where a seal member is formed on an active matrix substrate fabricated in the embodiment 1. Reference numeral 61 designates the active matrix substrate, and first seal members 62 are provided at plural places. The first seal member 62 is formed while an opening portion 63 is secured.

A filler (rod-like spacer) may be added in the first seal member 62. Besides, spherical spacers 64 are sprinkled on the whole active matrix substrate 61. The spacers 64 may be sprinkled before or after formation of the first seal member 62. In either case, it is possible to secure the distance between the active matrix substrate 61 and a cover member over the active matrix substrate 61 by the filler (not shown) or the spacers 64.

Incidentally, in view of suppression of deterioration of the EL element, it is effective to make the spacer 64 have a hygroscopic property. Besides, it is desirable that the spacer 64 is made of a material transmitting light emitted from the luminescent layer.

A pixel portion and a driving circuit portion are included in a region 65 surrounded by the seal member 62. In this specification, a portion constituted by the pixel portion and the driving circuit portion is called an active matrix portion.

That is, the active matrix substrate 61 is formed such that a plurality of active matrix portions each being made of a combination of the pixel portion and the driving circuit portion are formed on one large substrate.

Figure 11D:
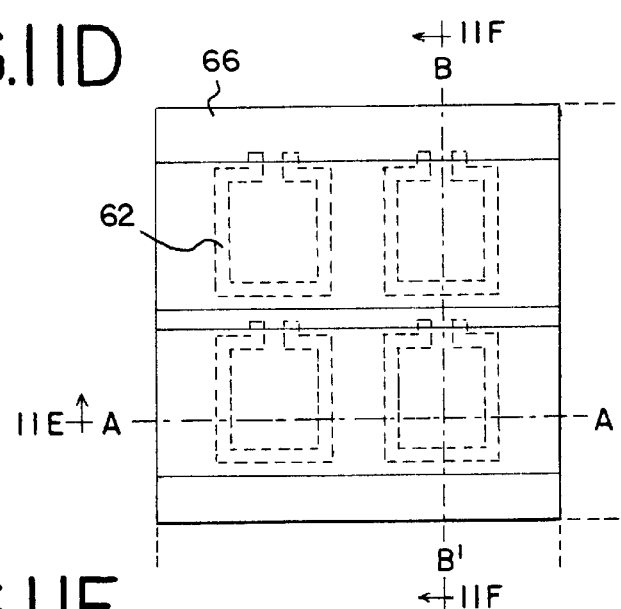
Figure 11F:
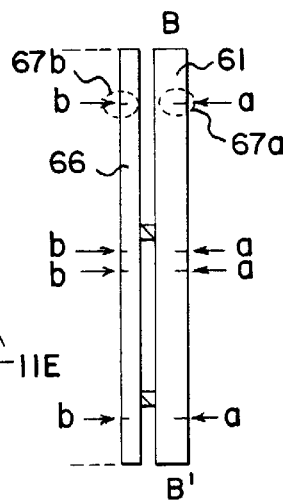
Figure 11E:
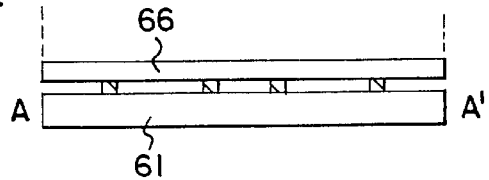

FIG. 11D shows a state where a cover member 66 is bonded to the active matrix substrate 61. In this specification, a cell including the active matrix substrate 61, the first seal member 62, and the cover member 66 is called an active matrix cell.

A process similar to a cell assembling step of liquid crystal may be used for the above bonding. Besides, as the cover member 66, a transparent substrate (or transparent film) having the same area as the active matrix substrate 61 may be used. Thus, in the state of FIG. 11D, it is used as the cover member common to all the active matrix portions.

After the cover member 66 is bonded, the active matrix cell is divided into parts. In this embodiment, when the active matrix substrate 61 and the cover member 66 are divided into parts, a scriber is used. The scriber is such a device that after a thin groove (scribe groove) is formed in the substrate, shock is given to the scribe groove to generate a crack along the scribe groove so that the substrate is divided into parts.

Incidentally, as a device for dividing a substrate into parts, a dicer is also known. The dicer is such a device that a hard cutter (also referred to as dicing saw) is rotated at high speed and is put to a substrate to divide it into parts. However, when the dicer is used, water is jetted to the dicing saw to prevent heat generation and splash of abrasive powder. Thus, in the case where the EL display device is fabricated, it is desirable to use the scriber, which does not use water.

As the sequence of forming the scribe groove in the active matrix substrate 61 and the cover member 66, first, a scribe groove 67a is formed in the direction of the arrow (a), and next, a scribe groove 67b is formed in the direction of the arrow (b). At this time, the scribe groove passing through the vicinity of the opening portion 63 is formed to cut the first seal member 62. By doing so, since the opening portion 63 appears at the end face of the active matrix cell, a subsequent injection step of a filler is facilitated.

When the scribe grooves are formed in this way, a shock is given to the scribe grooves by an elastic bar of silicone resin or the like to generate cracks, so that the active matrix substrate 61 and the cover member 66 are divided into parts.

Figure 12A:
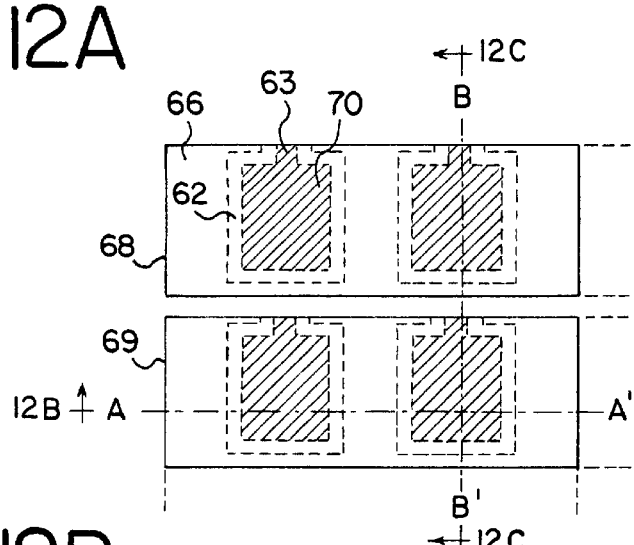
FIGS. 12A–12F are views showing the process of obtaining the multiple number of EL display devices.
Figure 12C:
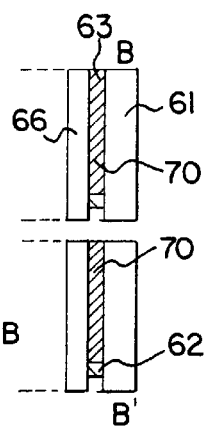
Figure 12B:
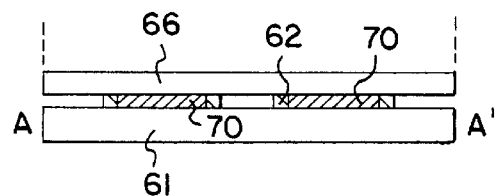
Figure 12D:
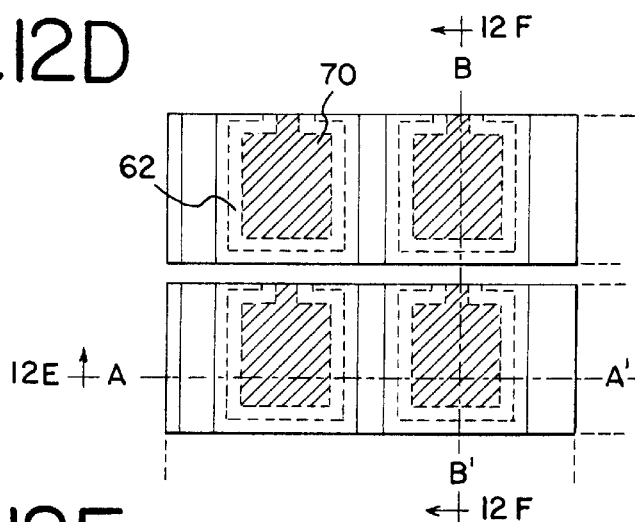
Figure 12F:
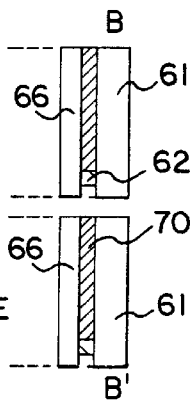
Figure 12E:
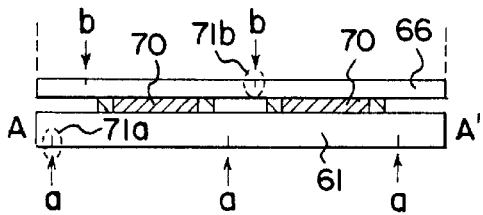
Figures 13A, 13B, 13C, 13D, 13E, 13F:
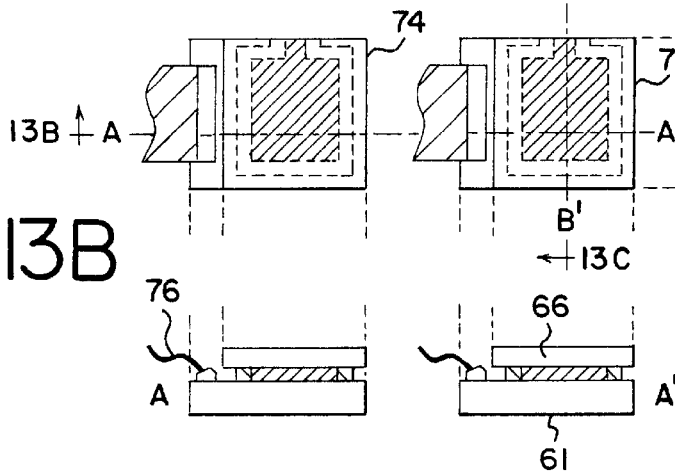
FIGS. 13A–13F are views showing the process of obtaining the multiple number of EL display devices.

FIG. 12A shows the state after the first division, and active matrix cells 68 and 69 each including two active matrix portions are formed through the division. Next, a filler 70 is injected into a space formed of the active matrix substrate 61, the first seal member 62 and the cover member 66 by a vacuum injection method. Since the vacuum injection method is well known as a technique of injecting liquid crystal, its explanation is omitted. At this time, it is preferable that the viscosity of the filler 70 is 3 to 15 cp. The filler having such viscosity may be selected, or desired viscosity may be made by dilution with a solvent or the like. Besides, the vacuum injection method may be carried out in the state where a drying agent is added in the filler.

In this way, the filler 70 is filled as shown in FIG. 12A. Incidentally, although this embodiment shows a system in which the filler 70 is filled into the plurality of active matrix cells at the same time, the system like this is suitable for fabrication of a small EL display device with a diagonal of about 0.5 to 1 inch. On the other hand, when a large EL display device with a diagonal of about 5 to 30 inches is fabricated, it is appropriate that after division into the respective active matrix cells is made, the filler 70 is filled.

After the filler 70 is filled in the manner described above, the filler 70 is hardened so that the adhesiveness between the active matrix substrate 61 and the cover member 66 is further raised. When the filler 70 is an ultraviolet ray curing resin, ultraviolet rays are irradiated, and when it is a thermosetting resin, heating is made. However, in the case where the thermosetting resin is used, attention must be paid to the heat resistance of the organic EL material.

Next, scribe grooves are again formed in the active matrix substrate 61 and the cover member 66. As the sequence, first, a scribe groove 71a is formed in the direction of the arrow (a), and next, a scribe groove 71b is formed in the direction of the arrow (b). At this time, the scribe grooves are formed so that the area of the cover member 66 becomes small as compared with the active matrix substrate 61 after the division.

After the scribe grooves are formed in this way, a shock is given to the scribe grooves by an elastic bar of silicone resin or the like to generate cracks, so that division into active matrix cells 72 to 75 is made. FIG. 13A shows the state after the second division. Further, an FPC 76 is attached to each of the active matrix cells 72 to 75.

Finally, as shown in FIG. 13D, a second seal member 77 is formed so as to cover the substrate end face (exposed face of the first seal member 62 or the filler 70) of each of the active matrix cells 72 to 75 and the FPC 76. The second seal member 77 may be formed of an ultraviolet ray curing resin or the like in which degassing hardly occurs.

By the process described above, the EL display device as shown in FIG. 13D is completed. As described above, by carrying out this embodiment, a plurality of EL display devices can be fabricated from one substrate. For example, from a substrate of 620 mm×720 mm, six EL display devices each having a diagonal of 13 to 14 inches can be formed, or four EL display devices each having a diagonal of 15 to 17 inches can be formed. Thus, a throughput can be greatly improved and manufacturing costs can be reduced.

Incidentally, the fabricating process of an EL display device of this embodiment can be used for fabrication of an EL display device including any structure of the embodiments 1 to 3.

[Embodiment 5]

In this embodiment, a description will be made on an example of a case where the filler 70 is not used in the embodiment 4. This embodiment is characterized in that after an active matrix cell is placed in a vacuum, a dry inert gas pressurized to 1 to 2 atmospheres is sealed in a region surrounded by the first seal member 62. As the inert gas, nitrogen or rare gas (typically argon, helium or neon) may be used.

Incidentally, this embodiment can use the process of the embodiment 4 as it is, except that a material vacuum injected in the embodiment 4 is made a gas. Thus, the fabricating process of the EL display device of this embodiment can be used for fabrication of the EL display device including any structure of the embodiments 1 to 3.

[Embodiment 6]

In the embodiments 1 to 5, although the description has been made on the EL display device, the present invention can also be used for an active matrix electrochromic display (ECD), field emission display (FED), or liquid crystal display (LCD).

That is, the present invention can be used for any electronic devices in which a light-emitting device or a light receiving element is electrically connected to an FET.

[Embodiment 7]

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an EL display (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a car navigation system, a sound reproduction device (an audio equipment), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital versatile disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 14 and 15 respectively show various specific examples of such electronic devices.

Figure 14A:
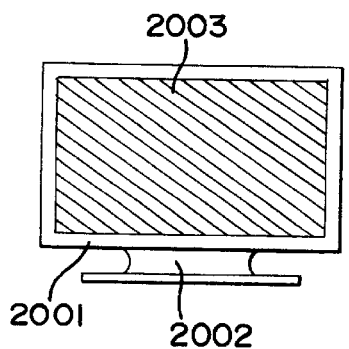
FIGS. 14A to 14F are views showing concrete examples of electronic devices.

FIG. 14A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 14B:
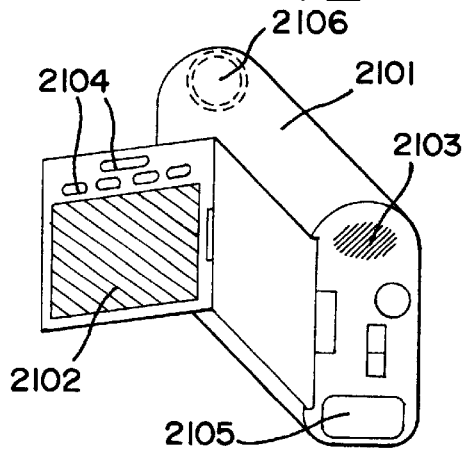

FIG. 14B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 14C:
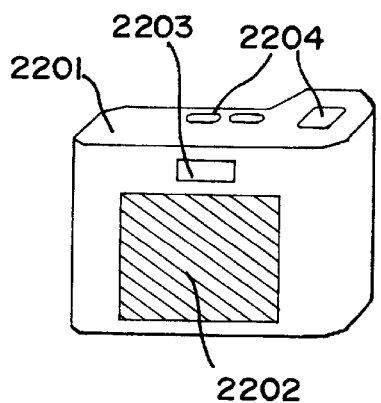

FIG. 14C illustrates a portion (the right-half piece) of an EL display of head mount type, which includes a main body 2201, signal cables 2202, a head mount band 2203, a display portion 2204, an optical system 2205, an EL display device 2206, or the like. The present invention is applicable to the EL display device 2206.

Figure 14D:
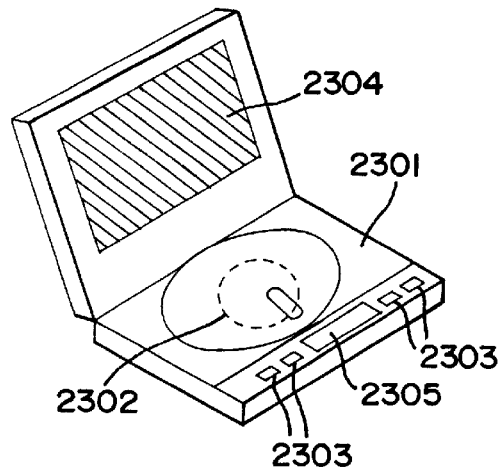

FIG. 14D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction apparatus, a game machine or the like.

Figure 14E:
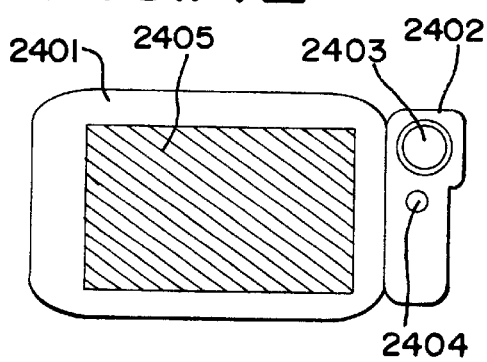

FIG. 14E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 14F:
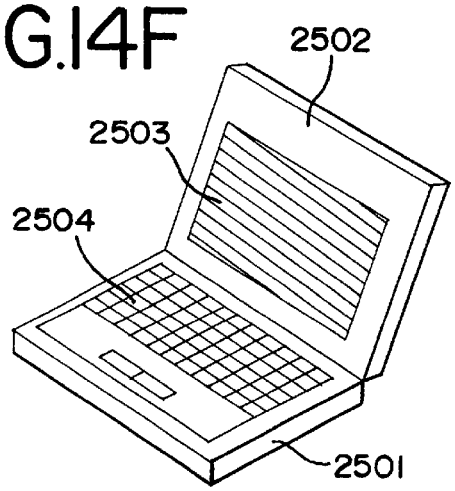

FIG. 14F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed. However, if the contour between the pixels becomes unclear, the moving pictures as a whole cannot be clearly displayed. Since the EL display device in accordance with the present invention can make the contour between the pixels clear, it is significantly advantageous to apply the EL display device of the present invention to a display portion of the electronic devices.

A portion of the EL display device that is emitting light consumes power, so it is desirable to display information in such a manner that the light-emitting portion therein becomes as small as possible. Accordingly, when the EL display device is applied to a display portion which mainly displays character information, e.g., a display portion of a portable information terminal, and more particular, a portable telephone or a sound reproduction equipment, it is desirable to drive the EL display device so that the character information is formed by a light-emitting portion while a non-emission portion corresponds to the background.

Figure 15A:
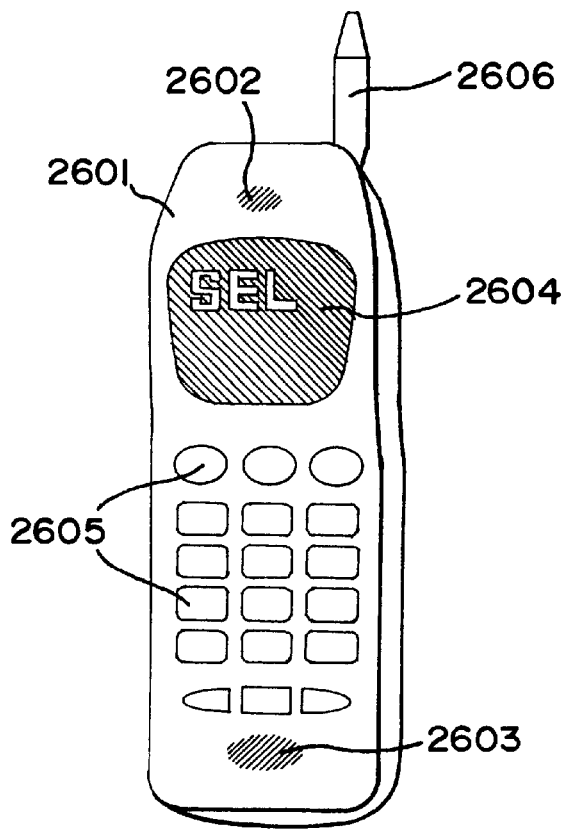
FIGS. 15A and 15B are views showing concrete examples of electronic devices.

With now reference to FIG. 15A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 15B:
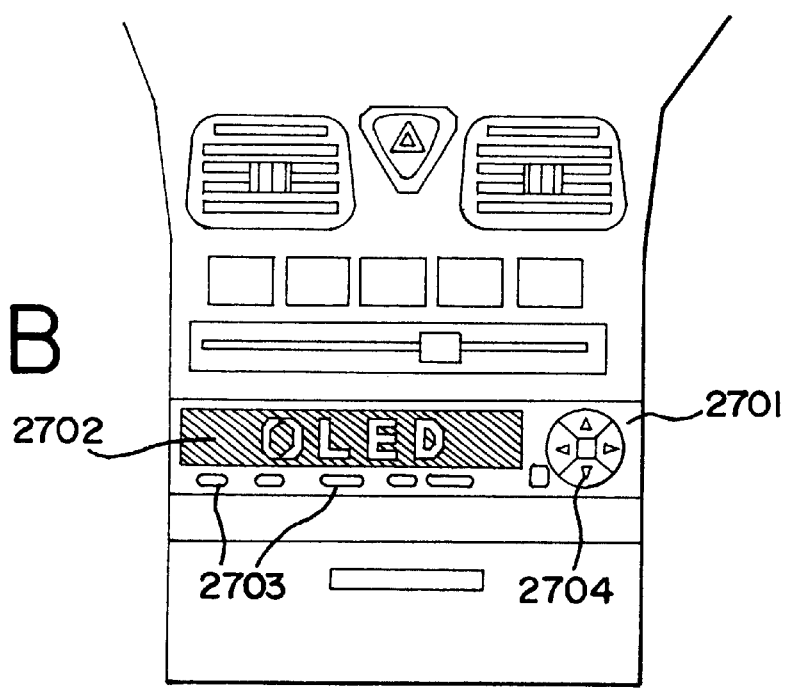

FIG. 15B illustrates a sound reproduction device, a car audio equipment in concrete term, which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to an audio of the set type. The display portion 2702 can reduce power consumption by displaying white-colored characters on a black-colored background, which is particularly advantageous for the audio of the portable type.

As set forth above, the present invention can be applied variously to a wide range of electronic devices in all fields. The electronic device in the present embodiment can be obtained by utilizing an EL display device having the configuration in which the structures in Embodiments 1 through 8 are freely combined.

According to the present invention, pixels using FETs having less fluctuation in characteristics can be realized, and an electronic device having less fluctuation in luminescent properties of light-emitting devices among pixels and high color reproducibility can be obtained. Besides, by arranging FETs having different structures according to the role in the pixel, an electronic device having high reliability can be obtained.

Further, by using the electronic device of the present invention as a display portion, an electronic instrument having high performance and high reliability can be obtained.

What is claimed is:

1. An electronic device comprising:
    a first FET;
    a second FET having at least one gate electrode electrically connected to a drain wiring line of said first FET; and
    a light-emitting device electrically connected to a drain wiring line of said second FET,
    wherein said second FET having an LDD region comprising single crystal semiconductor provided such that a part or all thereof overlaps with said gate electrode with a gate insulating film interposed therebetween.

2. An electronic device according to claim 1, wherein said LDD region of said second FET contains an n-type impurity element in a concentration range of $2\times10^{16}$ to $5\times10^{19}$ atoms/cm$^3$.

3. An electronic device according to claim 1, wherein said electronic device is a display device selected from the group consisting of an electroluminescence display device, a liquid crystal display device, a field emission display and a electrochromic display device.

4. An electronic device according to claim 3, wherein said display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

5. An electronic device comprising:
    a first FET comprising a plurality of FETs connected in series with each other;
    a second FET having at least one gate electrode electrically connected to a drain wiring line of said first FET;
    a light-emitting device electrically connected to a drain wiring line of said second FET;
    wherein said second FET includes an LDD region comprising single crystal semiconductor provided such that a part or all thereof overlaps with said gate electrode with a gate insulating film interposed therebetween.

6. An electronic device according to claim 5, wherein said LDD region of said second FET contains an n-type impurity element in a concentration range of $2\times10^{16}$ to $5\times10^{19}$ atoms/cm$^3$.

7. An electronic device according to claim 5, wherein said electronic device is a display device selected from the group consisting of an electroluminescence display device, a liquid crystal display device, a field emission display and a electrochromic display device.

8. An electronic device according to claim 7, wherein said display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

9. An electronic device having a pixel portion and a driving circuit portion,
    said driving circuit comprising an n-channel FET having an LDD region provided to overlap with a gate electrode with a gate insulating film interposed therebetween; and
    said pixel portion comprising a first FET, a second FET, and a light-emitting device electrically connected to said second FET,
    wherein said second FET having an LDD region comprising a single crystal semiconductor provided such that a part or all thereof overlaps with a gate electrode with a gate insulating film therebetween.

10. An electronic device according to claim 9, wherein said LDD region of said second FET contains an n-type impurity element in a concentration range of $2\times10^{16}$ to $5\times10^{19}$ atoms/cm$^3$.

11. An electronic device according to claim 9, wherein said electronic device is a display device selected from the group consisting of an electroluminescence display device, a liquid crystal display device, a field emission display and a electrochromic display device.

12. An electronic device according to claim 11, wherein said display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

13. An electronic device having a pixel portion and a driving circuit portion,
    said driving circuit portion comprising an n-channel FET having an LDD region provided to overlap with a gate electrode with a gate insulating film interposed therebetween; and
    said pixel portion comprising a first FET, a second FET, and a light-emitting device electrically connected to said second FET,
    wherein said first FET having a plurality of FETs connected in series with each other,
    wherein said second FET having an LDD region comprising a single crystal semiconductor provided such that a part or all thereof overlaps with a gate electrode with a gate insulating film interposed therebetween.

14. An electronic device according to claim 13, wherein said LDD region of said second FET contains an n-type impurity element in a concentration range of $2\times10^{16}$ to $5\times10^{19}$ atoms/cm$^3$.

15. An electronic device according to claim 13, wherein said electronic device is a display device selected from the group consisting of an electroluminescence display device, a liquid crystal display device, a field emission display and a electrochromic display device.

16. An electronic device according to claim 15, wherein said display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

17. An electronic device having at least a first FET and a second FET on a semiconductor substrate,
    said first FET comprising:
    first source and drain regions and a first channel region interposed therebetween formed in said semiconductor substrate; and
    a first gate electrode formed over said first channel region with a first gate insulating film interposed therebetween, and said second FET comprising:

second source and drain regions and a second channel region interposed therebetween formed in said semiconductor substrate; and a second gate electrode formed over said second channel region with a second gate insulating film interposed therebetween, said second gate electrode electrically connected to said first drain region, and wherein a light-emitting device is electrically connected to said second drain region, wherein at least one LDD region is formed in said semiconductor substrate so that a part or all of said LDD region overlaps said second gate electrode with said second gate insulating film interposed therebetween.

18. An electronic device according to claim 17, wherein said LDD region of said second FET contains an n-type impurity element in a concentration range of $2 \times 10^{16}$ to $5 \times 10^{19}$ atoms/cm$^3$.

19. An electronic device according to claim 17, wherein said electronic device is a display device selected from the group consisting of an electroluminescence display device, a liquid crystal display device, a field emission display and a electrochromic display device.

20. An electronic device according to claim 19, wherein said display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

21. An EL display device comprising:

a first FET including first source and drain regions and a first channel region interposed therebetween formed in a single crystalline semiconductor substrate, and a first gate electrode formed over said first channel region with a first gate insulating film interposed therebetween;

a second FET including second source and drain regions and a second channel region interposed therebetween formed in said single crystalline semiconductor substrate, and a second gate electrode formed over said second channel region with a second gate insulating film interposed therebetween, a light-emitting element electrically connected to said second FET, wherein said second FET is electrically connected to said first FET.

22. An EL display device according to claim 21, wherein said EL display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

23. An EL display device comprising:

a first FET including first source and drain regions and a first channel region interposed therebetween formed in a single crystalline semiconductor substrate, and a first gate electrode formed over said first channel region with a first gate insulating film interposed therebetween;

a second FET including second source and drain regions and a second channel region interposed therebetween formed in said single crystalline semiconductor substrate, and a second gate electrode formed over said second channel region with a second gate insulating film interposed therebetween; and a light-emitting element electrically connected to said second FET, wherein said second FET is electrically connected to said first FET, wherein at least one LDD region is formed in said semiconductor substrate so that a part or all of said LDD region overlaps said second gate electrode with said second gate insulating film interposed therebetween.

24. An EL display device according to claim 23, wherein said LDD region contains an n-type impurity element in a concentration range of $2 \times 10^{16}$ to $5 \times 10^{19}$ atoms/cm$^3$.

25. An EL display device according to claim 23, wherein said EL display device is incorporated into an electronic instrument selected from the group consisting of a video camera, a digital camera, a head-mount display, a car navigation system, an audio equipment, a note-size personal computer, a game machine, a portable information terminal and an image reproduction apparatus.

* * * * *